(12) United States Patent
Chang et al.

(10) Patent No.: US 12,533,766 B2
(45) Date of Patent: Jan. 27, 2026

(54) SIMPLIFIED CARRIER REMOVABLE BY REDUCED NUMBER OF CMP PROCESSES

(71) Applicant: Taiwan Semiconductor Manufacturing Co., Ltd., Hsinchu (TW)

(72) Inventors: Chun-Wei Chang, Hsinchu (TW); Ming-Fa Chen, Taichung (TW); Chao-Wen Shih, Zhubei (TW); Ting-Chu Ko, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 713 days.

(21) Appl. No.: 17/455,116

(22) Filed: Nov. 16, 2021

(65) Prior Publication Data

US 2022/0395953 A1    Dec. 15, 2022

Related U.S. Application Data

(60) Provisional application No. 63/209,456, filed on Jun. 11, 2021.

(51) Int. Cl.
  *B24B 7/22* (2006.01)
  *B24B 37/04* (2012.01)
  *B24B 37/08* (2012.01)
  *B24B 49/12* (2006.01)

(52) U.S. Cl.
  CPC ........... *B24B 7/228* (2013.01); *B24B 37/042* (2013.01); *B24B 37/08* (2013.01); *B24B 49/12* (2013.01)

(58) Field of Classification Search
  None
  See application file for complete search history.

(56) References Cited

U.S. PATENT DOCUMENTS

| | | | |
|---|---|---|---|
| 6,991,514 B1 | 1/2006 | Meloni et al. | |
| 10,388,608 B2 | 8/2019 | Mitsukura et al. | |
| 11,145,538 B2 | 10/2021 | Libbert et al. | |
| 11,637,086 B2 | 4/2023 | Lu et al. | |
| 2009/0280621 A1 | 11/2009 | Endo et al. | |
| 2018/0158721 A1* | 6/2018 | Libbert | H01L 21/02164 |
| 2018/0337134 A1 | 11/2018 | Mitsukura et al. | |
| 2019/0355692 A1 | 11/2019 | Yeh et al. | |

(Continued)

FOREIGN PATENT DOCUMENTS

| | | |
|---|---|---|
| CN | 110352484 A | 10/2019 |
| KR | 20130086109 A | 7/2013 |

(Continued)

*Primary Examiner* — Binh X Tran
(74) *Attorney, Agent, or Firm* — Slater Matsil, LLP

(57) ABSTRACT

A method includes bonding a first package component on a composite carrier, and performing a first polishing process on the composite carrier to remove a base carrier of the composite carrier. The first polishing process stops on a first layer of the composite carrier. A second polishing process is performed to remove the first layer of the composite carrier. The second polishing process stops on a second layer of the composite carrier. A third polishing process is performed to remove a plurality of layers in the composite carrier. The plurality of layers include the second layer, and the third polishing process stops on a dielectric layer in the first package component.

20 Claims, 33 Drawing Sheets

(56) References Cited

U.S. PATENT DOCUMENTS

| | | | |
|---|---|---|---|
| 2019/0371666 A1* | 12/2019 | Son | ................. H01L 21/845 |
| 2020/0006164 A1* | 1/2020 | Yu | ................. H01L 21/568 |
| 2021/0066222 A1 | 3/2021 | Chen et al. | |
| 2022/0246597 A1 | 8/2022 | Shibata et al. | |

FOREIGN PATENT DOCUMENTS

| | | |
|---|---|---|
| KR | 20180037238 A | 4/2018 |
| KR | 20190095322 A | 8/2019 |
| TW | 202109688 A | 3/2021 |
| WO | 2021038986 A1 | 3/2021 |

\* cited by examiner

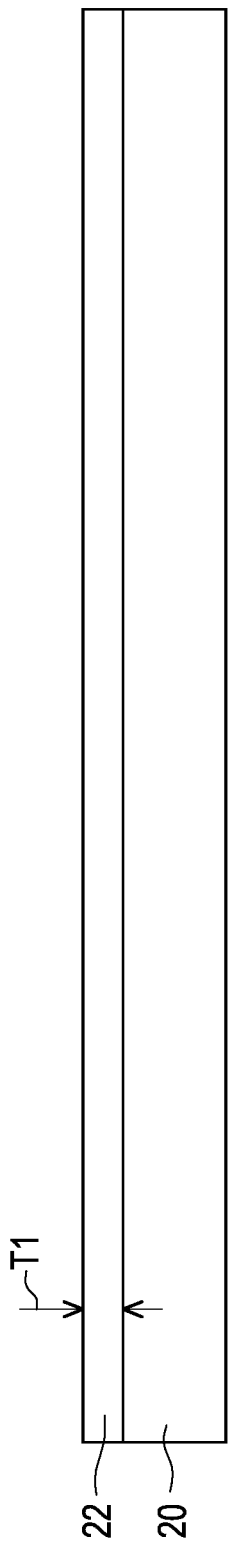

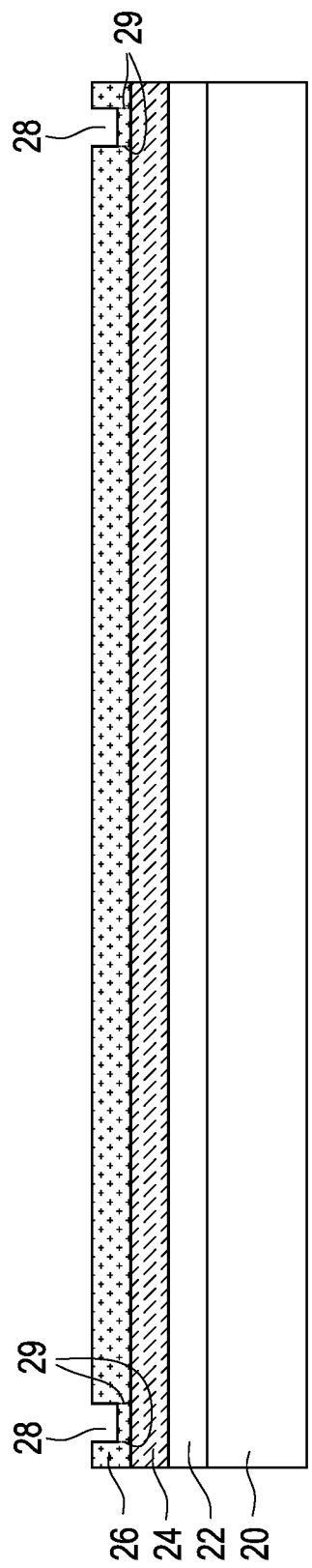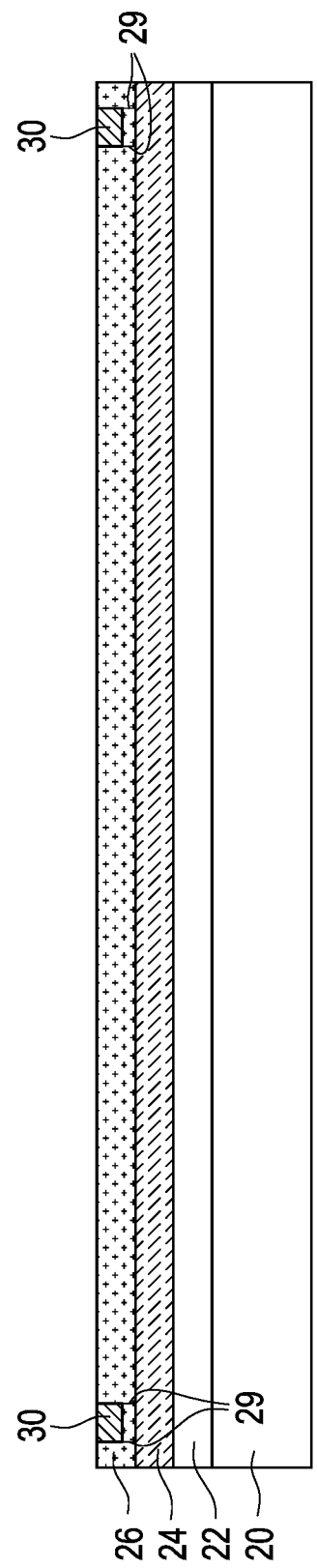

SIMPLIFIED CARRIER REMOVABLE BY REDUCED NUMBER OF CMP PROCESSES

PRIORITY CLAIM AND CROSS-REFERENCE

This application claims the benefit of the following provisionally filed U.S. patent application: Application No. 63/209,456, filed on Jun. 11, 2021, and entitled "New Simplified Carrier for SoIC," which application is hereby incorporated herein by reference.

BACKGROUND

Carriers are commonly used in the packaging of integrated circuits as a supporting mechanism, on which device dies are placed and molded. Conventionally, carriers may include a plurality of layers formed of different materials, which are suited for different functions. The different materials, however, may require multiple CMP processes to remove due to their different properties. A conventional carrier may require five CMP processes to remove, each for one layer of the materials. The manufacturing cost is thus high.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-10, 11A, 11B, 11C, and 12-19 illustrate the cross-sectional views and perspective views of intermediate stages in the formation of a composite carrier and a package in accordance with some embodiments.

DETAILED DESCRIPTION

Figure 3:
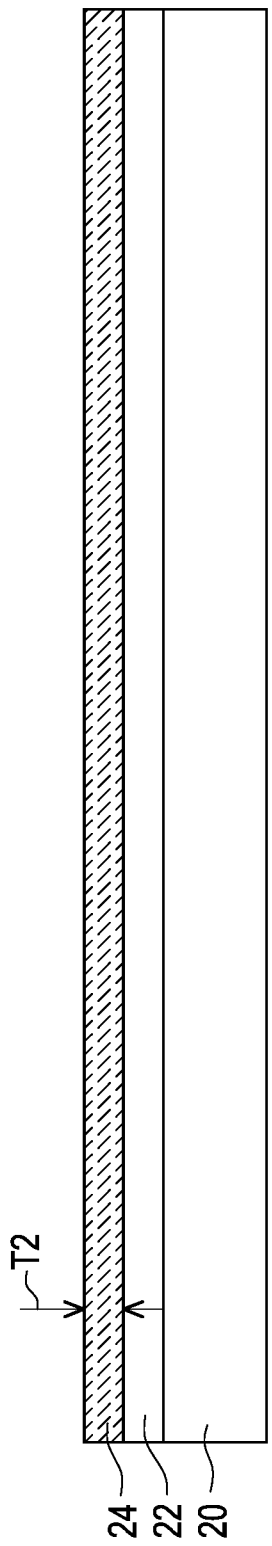

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A composite carrier and the method of forming the same are provided. A process for forming a package using the composite carrier is also illustrated. In accordance with some embodiments of the present disclosure, a composite carrier includes a silicon wafer, a first layer over the carrier, and a second plurality of layers over the first layer. The second plurality of layers are formed of similar materials. Alignment marks may be formed in the second plurality of layers. A plurality of package components may be bonded to the carrier, and a package is formed, which includes the plurality of package components. After the package is formed, three Chemical Mechanical Polish (CMP) processes are performed, with the first CMP process, the second CMP process, and the third CMP process used to remove the silicon carrier, the first layer, and the second plurality of layers, respectively. By forming the second plurality of layers as having similar materials, the second plurality of layers may be removed in the same CMP process, hence the manufacturing cost is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-10, 11A, 11B, 11C, and 12-19 illustrate the cross-sectional views and perspective views of intermediate stages in the formation of a composite carrier and a package using the composite carrier in accordance with some embodiments of the present disclosure. The corresponding processes are also reflected schematically in the process flow shown in FIG. 34.

Figure 11A:
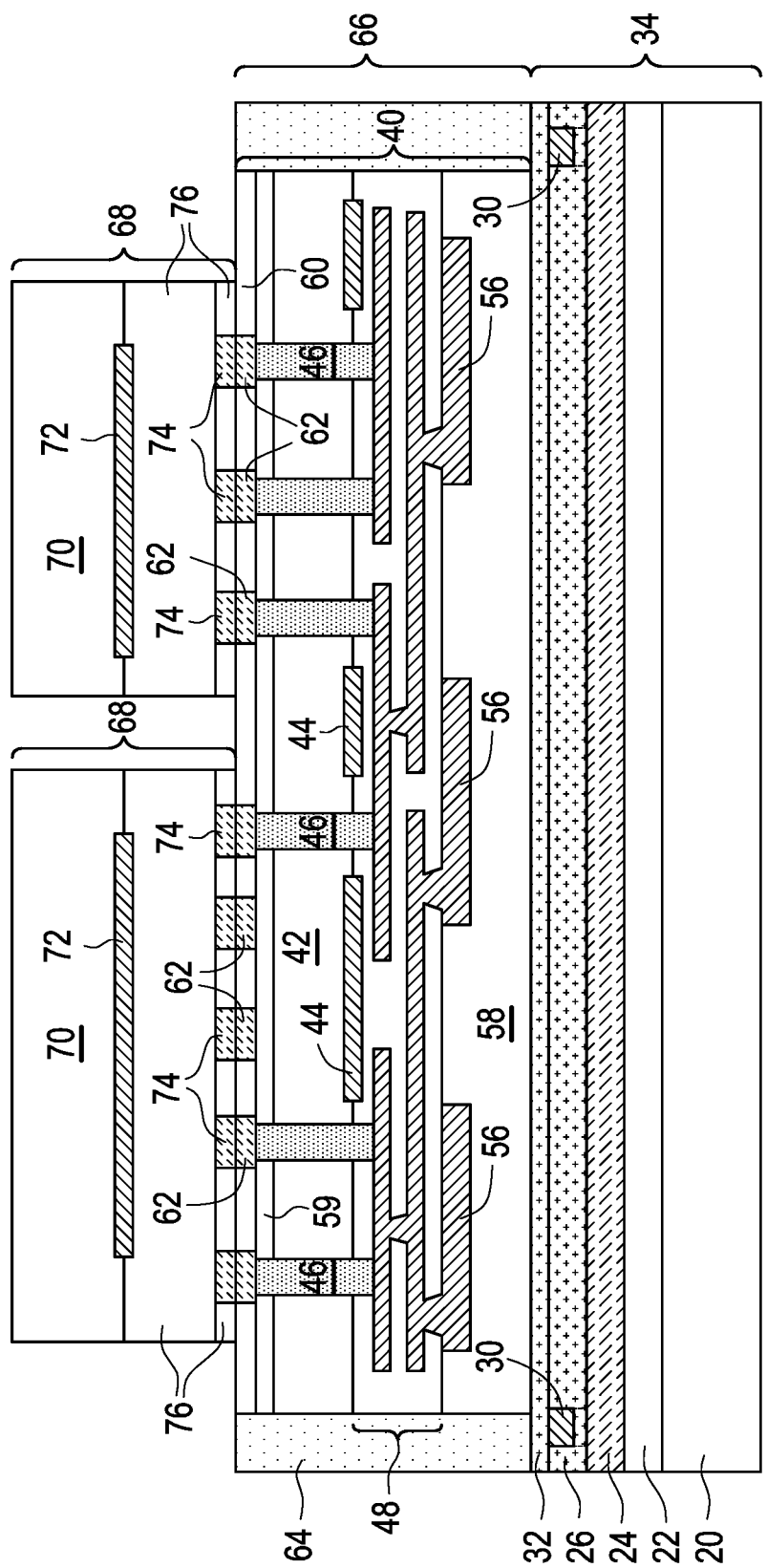
Figures 11B, 11C:
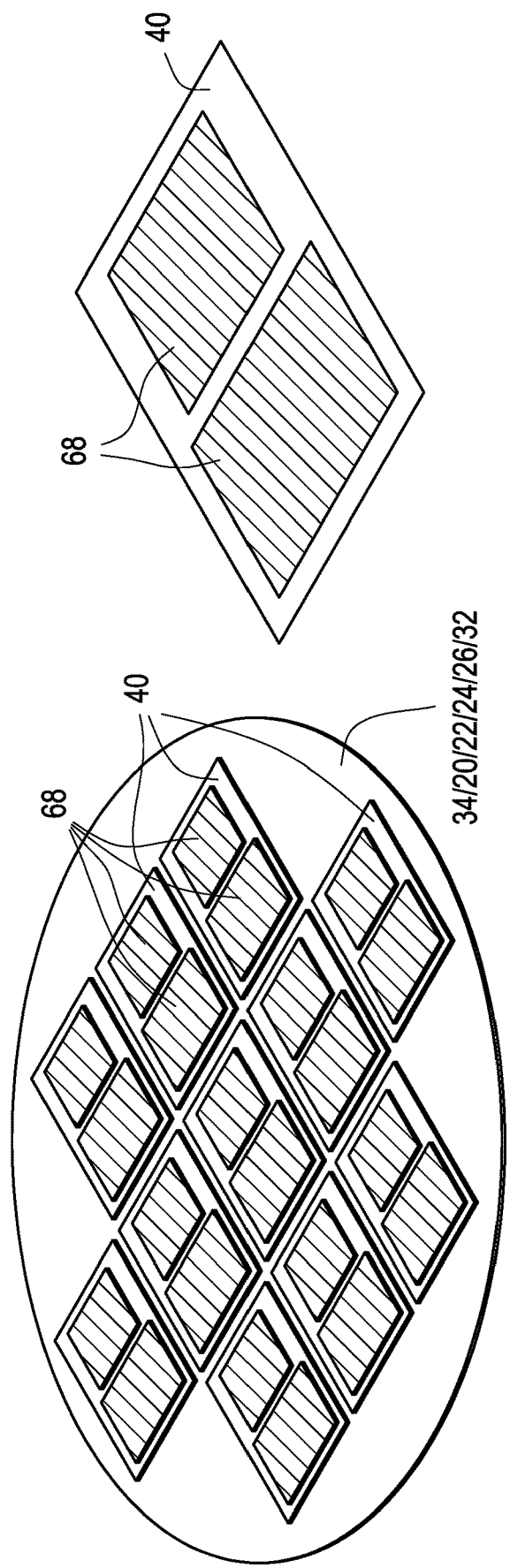

FIGS. 1 through 7 illustrate the cross-sectional views of intermediate stages in the formation of a composite carrier in accordance with some embodiments of the present disclosure. Referring to FIG. 1, base carrier 20 is provided. Base carrier 20 may be a wafer, which may have a round top view shape, as shown in FIG. 11B. Base carrier 20 may be formed of a same material as the substrate 42 (FIG. 8) in the overlying package component 40, so that in the subsequent packaging process, the warpage caused by mismatch of Coefficients of Thermal Expansion (CTE) is reduced. In accordance with some embodiments, base carrier 20 may be formed of or comprise silicon, while other materials such as laminate, ceramic, glass, silicate glass, or the like, may also be used. In accordance with some embodiments, the entire base carrier 20 is formed of a homogeneous material, with no other material different from the homogeneous material therein. For example, the entire base carrier 20 may be formed of silicon (doped or undoped), and there is no metal region, dielectric region, etc., therein.

Figure 34:
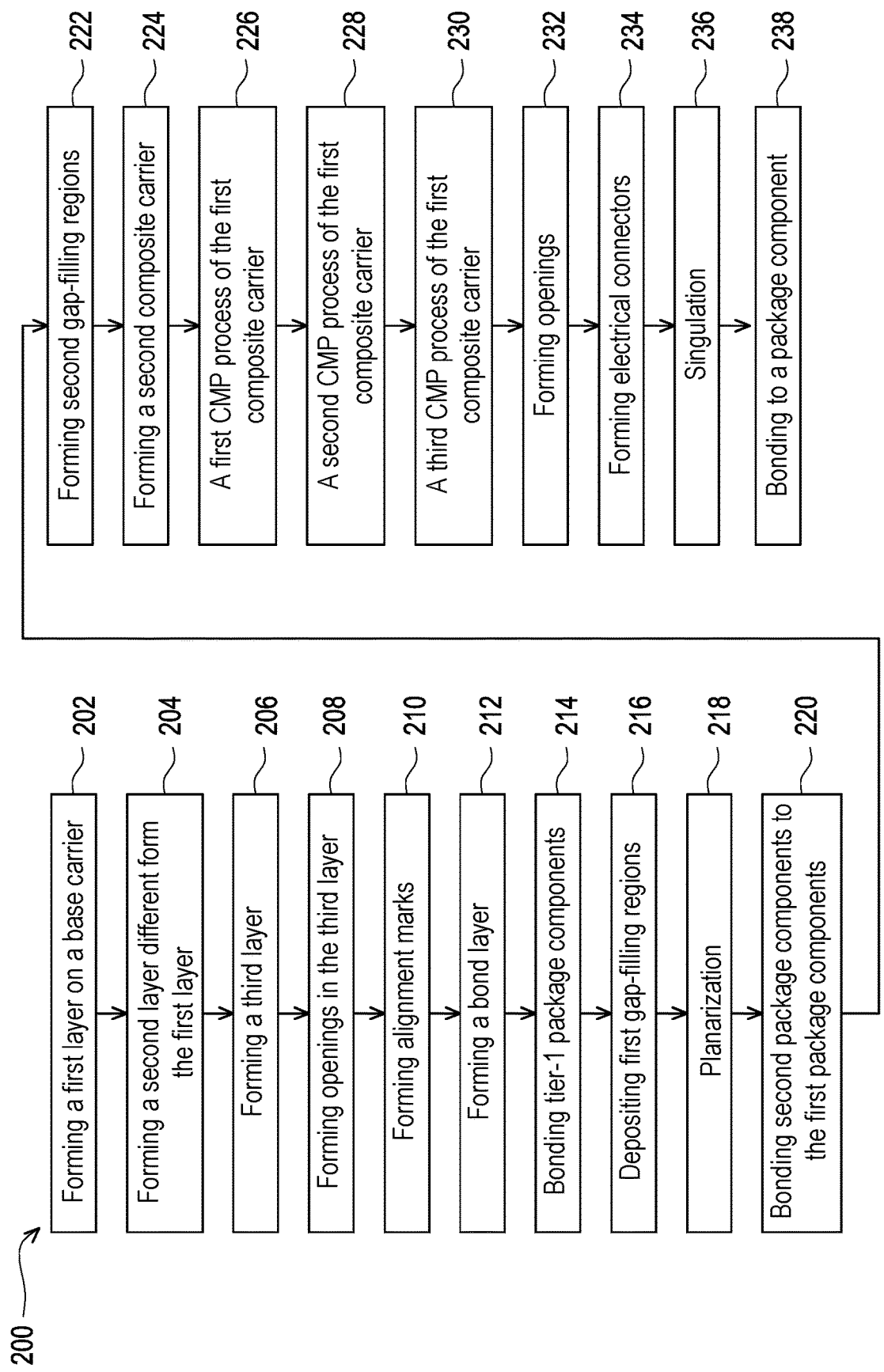
FIG. 34 illustrates a process flow for forming a composite carrier and a package using the carrier in accordance with some embodiments.

Referring to FIG. 2, layer 22 is deposited on base carrier 20. The respective process is illustrated as process 202 in the process flow 200 as shown in FIG. 34. Layer 22 is formed of a material different from the material of base carrier 20, so that in a subsequent CMP process, layer 22 may be used as a CMP stop layer. In accordance with some embodiments, layer 22 is formed of or comprises a dielectric material, which may be an oxide-based material (which may also be silicon oxide based) such as silicon oxide, phospho-silicate glass (PSG), borosilicate glass (BSG), boron-doped phospho silicate glass (BPSG), fluorine-doped silicate glass (FSG), or the like. Layer 22 may be formed using spin coating, Flowable Chemical Vapor Deposition (FCVD), or the like. In accordance with alternative embodiments of the present disclosure, layer 22 is formed through the oxidation of base carrier 20 to form a thermal oxide layer. In accordance with yet alternative embodiments of the present disclosure, layer 22 is formed using a deposition method such as Plasma Enhanced Chemical Vapor Deposition (PECVD), Low Pressure Chemical Vapor Deposition (LPCVD), Atomic Layer Deposition (ALD), or the like. In accordance with some embodiments, the entire layer 22 is formed of a homogeneous material, with no other material different from the homogeneous material therein.

After the deposition, layer 22 may be planarized, for example, through a CMP process or a mechanical grinding process. The resulting layer 22 may have thickness T1 in the range between about 1,500 Å and about 2,500 Å, while a different thickness may be used.

Figure 4:
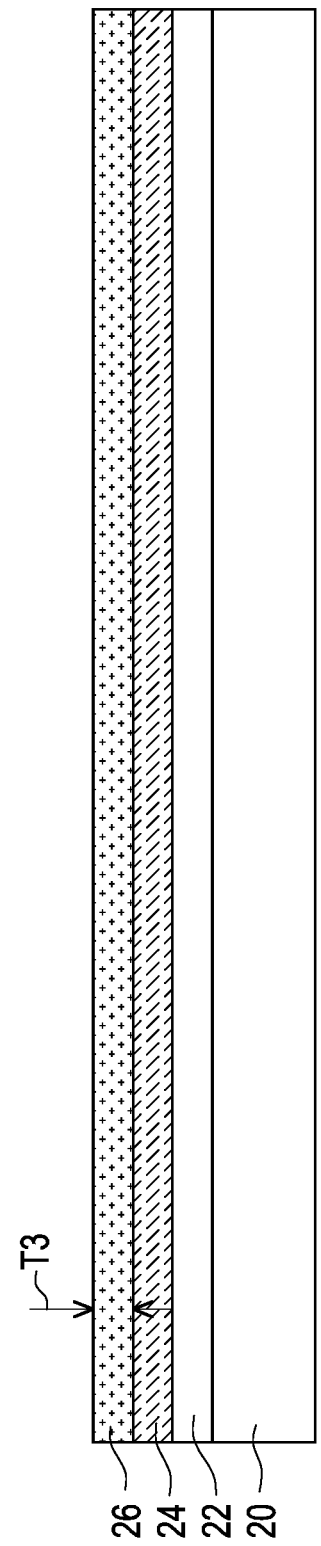

Referring to FIG. 3, layer 24 is deposited on layer 22. The respective process is illustrated as process 204 in the process flow 200 as shown in FIG. 34. Layer 24 is formed of a material different from the material of layer 22, so that layer 24 may be a CMP stop layer in the subsequent removal of layer 22. Furthermore, with layer 24 being formed of a material different from layer 22, the unevenness in the removal of layer 22 may be compensated for. The material of layer 24 may also be different from the material of base carrier 20, so that in the subsequent CMP process of base carrier 20, which is thick, layer 24 may also be used as a CMP stop layer when layer 22 fails to stop the CMP process. Furthermore, the material of layer 24 is also different from the material of the surface dielectric bond layer 58 (FIGS. 15 and 16), so that in the subsequent CMP processes of layers 24, 26, and 32, as shown in FIG. 16, surface dielectric bond layer 58 is not removed. In addition, layer 24 may act as an adhesion layer between layer 22 and the subsequently formed layer 26 (FIG. 4). In accordance with some embodiments, the entire layer 24 is formed of a homogeneous material, with no other material different from the homogeneous material therein.

Layer 24 may be formed of or comprises a dielectric material, which may be a nitride-based material such as silicon nitride, while it may also be formed of or comprises other materials such as silicon oxynitride (SiON). In accordance with some embodiments of the present disclosure, layer 24 is formed using PECVD, CVD, LPCVD, ALD, or the like. Layer 24 may have thickness T2 in the range between about 1,000 Å and about 2,000 Å, while a different thickness may be used.

Referring to FIG. 4, layer 26 is deposited on layer 24. The respective process is illustrated as process 206 in the process flow 200 as shown in FIG. 34. Layer 26 is formed of a material similar to the material of layer 24, so that layer 26 may be removed in a same CMP process as layer 24 in a subsequent CMP process. On the other hand, the material of layer 26 may also have some difference from the material of layer 24, so that in the formation of alignment marks, layer 24 may be used as an etch stop layer in the formation of openings 28, if openings 28 penetrate through layer 24. Furthermore, the material of layer 26 is also different from the material of the surface dielectric bond layer 58 (FIGS. 15 and 16), so that in the subsequent CMP processes as shown in FIG. 16, surface dielectric bond layer 58 is not removed.

In accordance with some embodiments, layer 26 is formed of or comprises a dielectric material, which may be an oxynitride based material such as silicon oxynitride (SiON), while it may also be formed of or comprises other materials such as silicon oxycarbide (SiOC), silicon carbonitride (SiCN), or the like. In accordance with some embodiments of the present disclosure, layer 26 is formed using PECVD, CVD, LPCVD, ALD, or the like. Layer 26 may have thickness T3 in the range between about 2,000 Å and about 3,000 Å, while a different thickness may be used. In accordance with some embodiments, the entire layer 26 is formed of a homogeneous material, with no other material different from the homogeneous material therein.

Referring to FIG. 5, openings 28 are formed in layer 26. The respective process is illustrated as process 208 in the process flow 200 as shown in FIG. 34. In accordance with some embodiment, the formation of opening 28 is performed through lithography and etching, wherein a photo resist (not shown) may be applied and then patterned, and layer 26 is etched using the patterned photo resist as an etching mask. Openings 28 are used for forming alignment marks, and the patterns, the sizes, the shapes, and the positions are designed according to the requirement of alignment marks. For example, openings 28 are arranged as having a distinguishable pattern for an aligner. In accordance with some embodiments, openings 28 are formed to extend partially into layer 26. In accordance with alternative embodiments, openings 28 are formed to penetrate through layer 26, and accordingly, the top surface of layer 24 is exposed. Dashed lines 29 represent the corresponding edges of the bottom parts of openings 28 when openings 28 penetrate through layer 26.

FIG. 6 illustrates the formation of alignment marks 30, which may be formed of or comprise a metal, a metal alloy, a metal compound, etc., to increase the contrast of alignment marks 30 relative to the surrounding material. The respective process is illustrated as process 210 in the process flow 200 as shown in FIG. 34. In accordance with some embodiments, alignment marks 30 comprise metal regions formed of or comprise copper, a copper alloy, tungsten, nickel, and or the like. An adhesion layer may or may not be formed underlying and lining the metal regions. The adhesion layer may be formed of or comprise titanium, titanium nitride, tantalum, tantalum nitride, or the like. The formation process may include depositing the adhesion layer (if formed) as a conformal layer, for example using Physical Vapor Deposition (PVD), depositing the metallic material over the adhesion region, and then performing a CMP process to remove excess portions of the adhesion layer and the metallic material, leaving alignment marks 30 in layer 26.

In accordance with some embodiments, alignment marks 30 are formed in layer 26, as shown in FIG. 5. In accordance with alternative embodiments, alignment marks 30 may be formed in other layers, for example, in layers 24, 22, or in base layer 20, or in the subsequently formed bond layer 32 as shown in FIG. 7.

Figure 7:
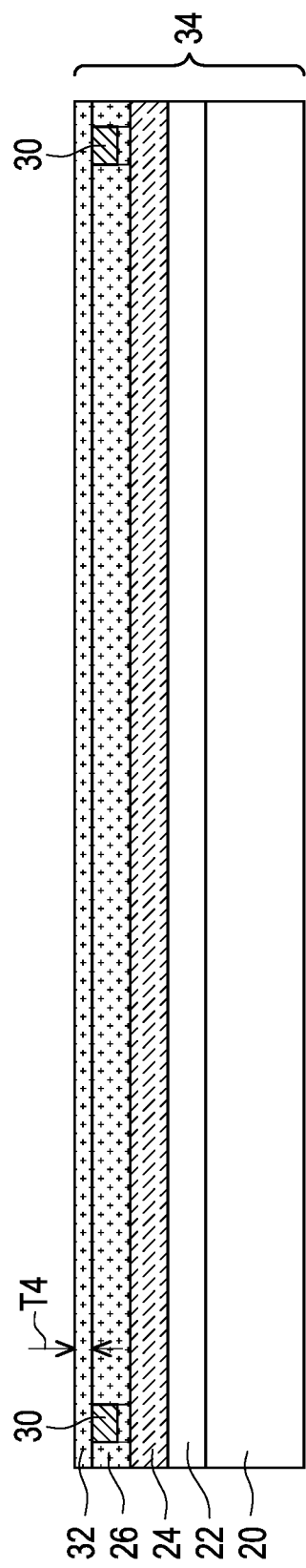

Referring to FIG. 7, bond layer 32 is deposited on layer 24. The respective process is illustrated as process 212 in the process flow 200 as shown in FIG. 34. Bond layer 32 is formed of a material similar to the materials of layers 24 and 26, so that bond layer 32 may be removed in a same CMP process as layers 24 and 26 in a subsequent CMP process. In accordance with some embodiments, the material of layers 32 and 26 are the same as each other. Accordingly, there may be, or may not be, a distinguishable interface between layers 32 and 26. In accordance with other embodiments, the material of layers 32 and 26 are different from each other. Furthermore, the material of bond layer 32 is also different from the material of the surface dielectric bond layer 58 (FIGS. 15 and 16), so that in the subsequent CMP processes as shown in FIG. 16, surface dielectric bond layer 58 is not removed. In accordance with some embodiments, bond layer 32 is formed of or comprises a dielectric material, which may be an oxynitride based material such as silicon oxynitride (SiON). In accordance with some embodiments, layer 26 and bond layer 32 are formed of the same material with the same composition, for example, both formed of SiON with the same Si, O, and N atomic percentages. In accordance with alternative embodiment, layer 26 and bond layer 32 are formed of similar materials having the same elements such as Si, O, and N, while the percentages of the elements are different from each other. For example, bond layer 32 may have a greater oxygen atomic percentage (and possibly lower nitrogen atomic percentage) than layer 26, so that the bond strength with dielectric bond layer 58 (FIG. 8) is improved, while layer 26 and bond layer 32 may still be removed in the same CMP process.

In accordance with some embodiments of the present disclosure, bond layer 32 is formed using PECVD, CVD, LPCVD, ALD, or the like. Bond layer 32 may have thickness T4 in the range between about 400 Å and about 600 Å, while a different thickness may be used. In accordance with some embodiments, the entire bond layer 32 is formed of a homogeneous material, with no other material different from the homogeneous material therein. Bond layer has the function of preventing the oxidation of alignment marks 30.

In accordance with some embodiments, layers 22, 24, 26, and bond layer 32 have distinguishable interfaces in between, regardless of their materials. In accordance with alternative embodiments, layers 26 and 32 do not have distinguishable interface in between, while distinguishable interfaces are formed between all other neighboring layers.

Figure 8:
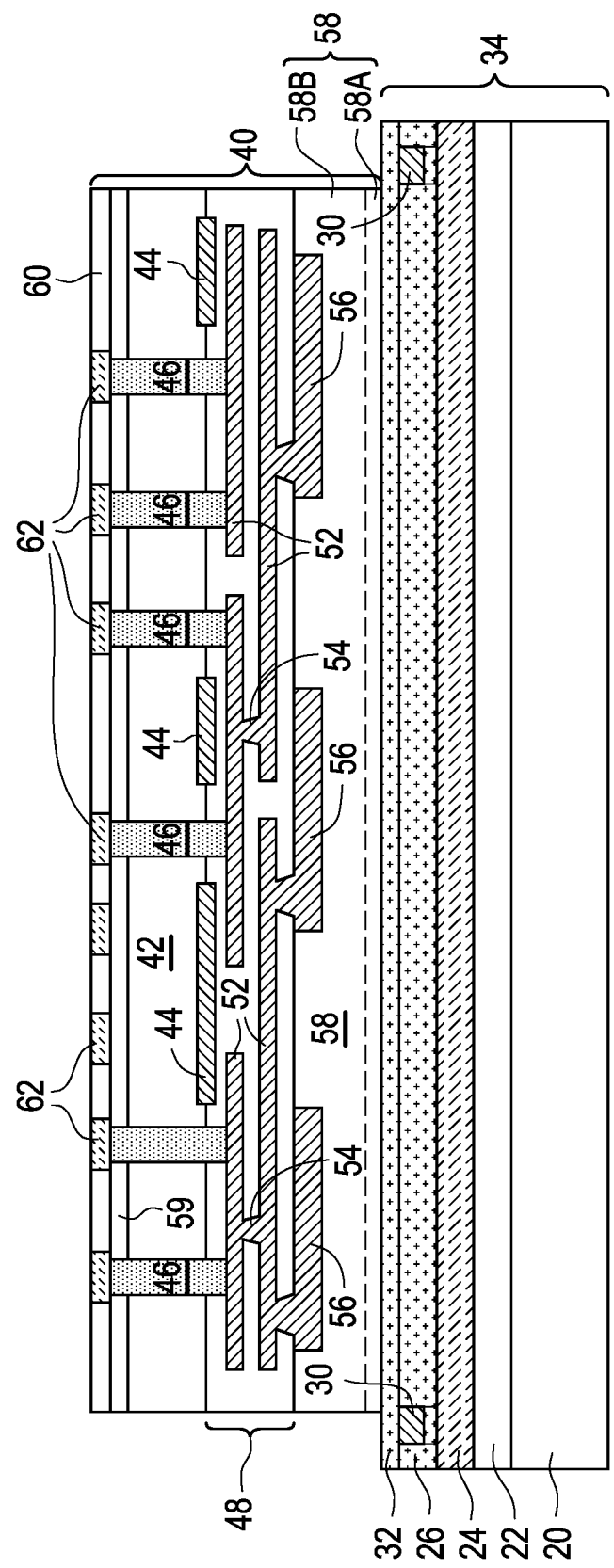

As will be discussed in subsequent paragraphs, layers 24 and 26 and bond layer 32 will be removed in a same CMP process using a same slurry. This may be achieved by selecting appropriate similar materials for layers 24 and 26 and bond layer 32, and also selecting proper slurries, so that regardless of whether layers 24 and 26 and bond layer 32 are formed of the same materials or different materials, layers 24, 26, and 32 may be removed in the same CMP process, while the CMP may stop on dielectric bond layer 58 (FIG. 16). For example, when layer 24 is formed of SiN, while layers 26 and 32 are formed of SiON, the oxygen atomic percentage in layers 26 and 32 may be lower than about 20 percent, or lower than about 10 percent or about 5 percent. In accordance with some embodiments, the oxygen atomic percentages in layers 26 and 32 are in the range between about 10 percent and about 15 percent. On the other hand, including some oxygen in bond layer 32 may improve the bonding strength of the bonding between bond layer 32 and dielectric bond layer 58 (FIG. 8). The nitrogen atomic percentage values of layers 24, 26, and 32 may be greater than about 70 percent, and may be in the range between about 50 percent and about 80 percent.

Throughout the description, base carrier 20 and the overlying layers 22, 24, 26, and 32 are collectively referred to as composite carrier 34, which may be used for supporting package components in packaging processes.

Referring to FIG. 8, tier-1 package components 40 are bonded to composite carrier 34 through fusion bonding. The respective process is illustrated as process 214 in the process flow 200 as shown in FIG. 34. Although one package component 40 is illustrated, there may be a plurality of package components 40 identical to each other, as shown in FIG. 11B. The plurality of package components 40 may be discrete package components physically separate from each other, and the bonding process as shown in FIG. 8 is a die-to-wafer bonding. Alternatively, package components 40 may be inside an un-sawed wafer, and the bonding process as shown in FIG. 8 is a wafer-to-wafer bonding.

In accordance with some embodiments, package components 40 are device dies, packages having device die packaged therein, System-on-Chip (SoC) dies including a plurality of integrated circuits (or device dies) integrated as a system, or the like. The device dies in package components 40 may be or may comprise logic dies, memory dies, input-output dies, Integrated Passive Devices (IPDs), or the like, or combinations thereof. For example, the logic device dies in package components 40 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 40 may include Static Random Access Memory (SRAM) dies, Dynamic Random Access Memory (DRAM) dies, or the like. The device dies in package components 40 may include semiconductor substrates and interconnect structures.

In accordance with some embodiments, a package component 40 may include substrate 42, integrated circuit devices 44 at a surface of substrate 42, and through-substrate vias 46 penetrating through substrate 42. Substrate 42 may be a semiconductor substrate such as a silicon substrate. Integrated circuit devices 44 may include active devices, passive device, and the like. Interconnect structure 48 is on the front side of package components 40, and include metal line 52 and vias 54 electrically connected to through-vias 46 and integrated circuit devices 44. Metal pads 56, which may be Under-Bump Metallurgies (UBMs), are electrically connected to through-vias 46 and integrated circuit devices 44. Through-vias 46 may have top portions protruding out of the back surface (the illustrated top surface) of substrate 42, and the top portions are in dielectric layer 59. Bond pads 62 are electrically connected to through-vias 46, and are in dielectric layer 60.

Dielectric bond layer 58 is at the bottom of package component 40. Dielectric bond layer 58 is formed of or comprises a material different from the material of layers 24, 26, and 32 in composite carrier 34. In accordance with some embodiments, the materials of dielectric bond layer 58 may include O—Si—O bonds, Si—O—H bonds, N—Si—O bonds, and may include $SiO_2$, SiON, or the like. It is appreciated that the materials of bond layer 32 and dielectric bond layer 58 may be swapped. Bond layer 32 and dielectric bond layers 58 may include oxygen, and OH bonds at their surfaces, which OH bonds are joined to silicon atoms.

In accordance with some embodiments, dielectric bond layer 58 is a single layer formed of a homogeneous material. In accordance with alternative embodiments, dielectric bond layer 58 is a composite layer including a lower layer 58A and an upper layer 58B. In accordance with these embodiments, lower layer 58A may be formed of a material similar to or the same as the materials of layers 24, 26 and 32, which material has higher bonding strength to bond layer 32 than upper layer 58B. Upper layer 58B is formed of a material different from lower layer 58A, and may be used for stopping the CMP of bond layer 32 and lower layer 58A. For example, lower layer 58A may be formed of SiN or SiON, while upper layer 58B may be formed of $SiO_2$.

In accordance with some embodiments, the bonding of package components 40 to composite carrier 34 includes pre-treating bond layers 32 and 58 in a process gas comprising oxygen ($O_2$) and/or nitrogen ($N_2$), performing a pre-bonding process to join bond layers 32 and 58 together, and performing an annealing process following the pre-bonding process. In accordance with some embodiments, during the pre-bonding process, package components 40 are put into contact with composite carrier 34, with a pressing force applied to press package components 40 against composite carrier 34. The pre-bonding may be performed at room temperature (between about 20° C. and about 25° C.), and a higher temperature may also be used.

After the pre-bonding, an annealing process is performed. Si—O—Si bonds may be formed between bond layers 32 and 58, so that bond layers 32 and 58 are bonded to each other with high bonding strength. In accordance with some embodiments, the annealing process is performed at a temperature between about 200° C. and about 350° C. The annealing duration may be in the range between about 30 minutes and about 60 minutes.

Figure 9:
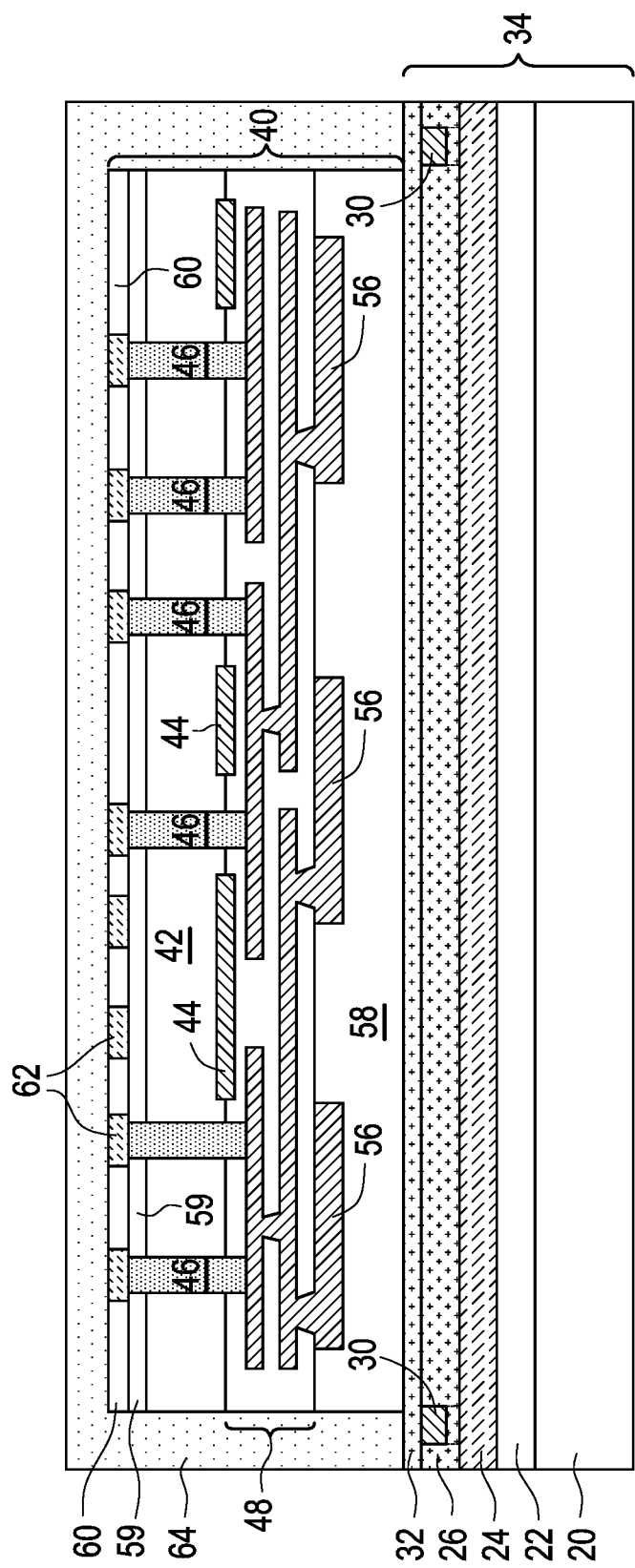

FIG. 9 illustrates the deposition of gap-filling material (regions) 64 to encapsulate package components 40. The respective process is illustrated as process 216 in the process flow 200 as shown in FIG. 34. In accordance with some embodiments in which package components 40 are in an unsawed wafer, the gap-filling process may be skipped. In accordance with some embodiments, gap-filling regions 64 are formed of or comprise inorganic materials. For example, the formation of gap-filling regions 64 may include depositing a dielectric liner (which is also an etch stop layer) and a dielectric material over the dielectric liner. The dielectric liner may be a conformal layer extending to the top surfaces and the sidewalls of package components 40. The etch stop layer is formed of a dielectric material that has good adhesion to the sidewalls of package components 40. In accordance with some embodiments of the present disclosure, the etch stop layer is formed of a nitride-containing material such as silicon nitride. The deposition of the etch stop layer may include a conformal deposition process such as ALD or CVD. The dielectric material deposited on the etch stop layer may be formed of or comprise silicon oxide. In accordance with alternative embodiments, gap-filling regions 64 are formed of a molding compound, an epoxy, a resin, and/or the like.

Figure 10:
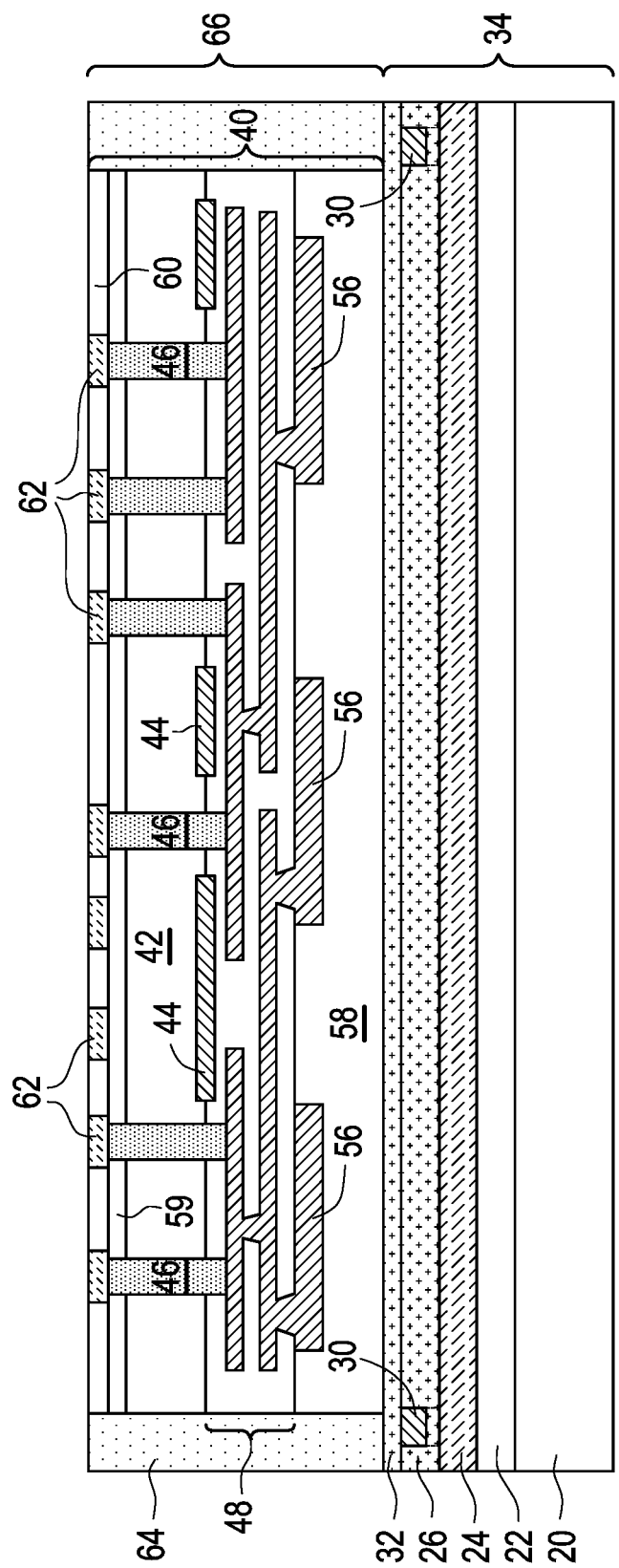

Referring to FIG. 10, a planarization process such as a CMP process or a mechanical grinding process is performed to level the back surface (the illustrated top surface) of package components 40 with the top surface of gap-filling regions 64. The respective process is illustrated as process 218 in the process flow 200 as shown in FIG. 34. The planarization process is stopped after bond pads 62 and dielectric layer 60 are exposed. Throughout the description, package components 40 and gap-filling regions 64 are collectively referred to as reconstructed wafer 66. Gap-filling regions 64 encircle the corresponding package components 40 when viewed in a top view of the reconstructed wafer 66.

FIGS. 11A, 11B, 11C, and 12 illustrate the views of intermediate stages in the bonding of tier-2 package components 68 to reconstructed wafer 66. The respective process is illustrated as process 220 in the process flow 200 as shown in FIG. 34. Although one group of package components 68, which include two package components 68, is illustrated as an example, a plurality of groups of package components 68 may be bonded, each to one of package components 40 in reconstructed wafer 66. The bonding of package components 68 to reconstructed wafer 66 may be achieved through hybrid bonding, in which both of metal-to-metal direct bonding (between bond pads 62 and 74) and dielectric-to-dielectric bonding (such as Si—O—Si bonding between surface dielectric layers 76 and 60) are formed. Furthermore, there may be a single or a plurality of package components 68 bonded to the same package component 40. The plurality of package components 68 bonded to the same package component 40 may be identical to, or different from, each other.

In accordance with some embodiments, package components 68 include device dies therein, and may include other package components such as interposers, packages, die stacks, or the like. In accordance with some embodiments, package components 68 include logic dies, memory dies, Independent Passive Devices (IPDs), and/or the like. In accordance with some embodiments, package components 68 include semiconductor substrates 70, integrated circuit devices 72, bond pads 74, and dielectric layers 76.

FIG. 11B illustrates a perspective view illustrating composite carrier 34, a plurality of tier-1 package components 40, and a plurality of tier-2 package components 68. FIG. 11C illustrates an amplified view of one of tier-1 package components 40 and the corresponding tier-2 package components 68 bonded thereon.

Figure 12:
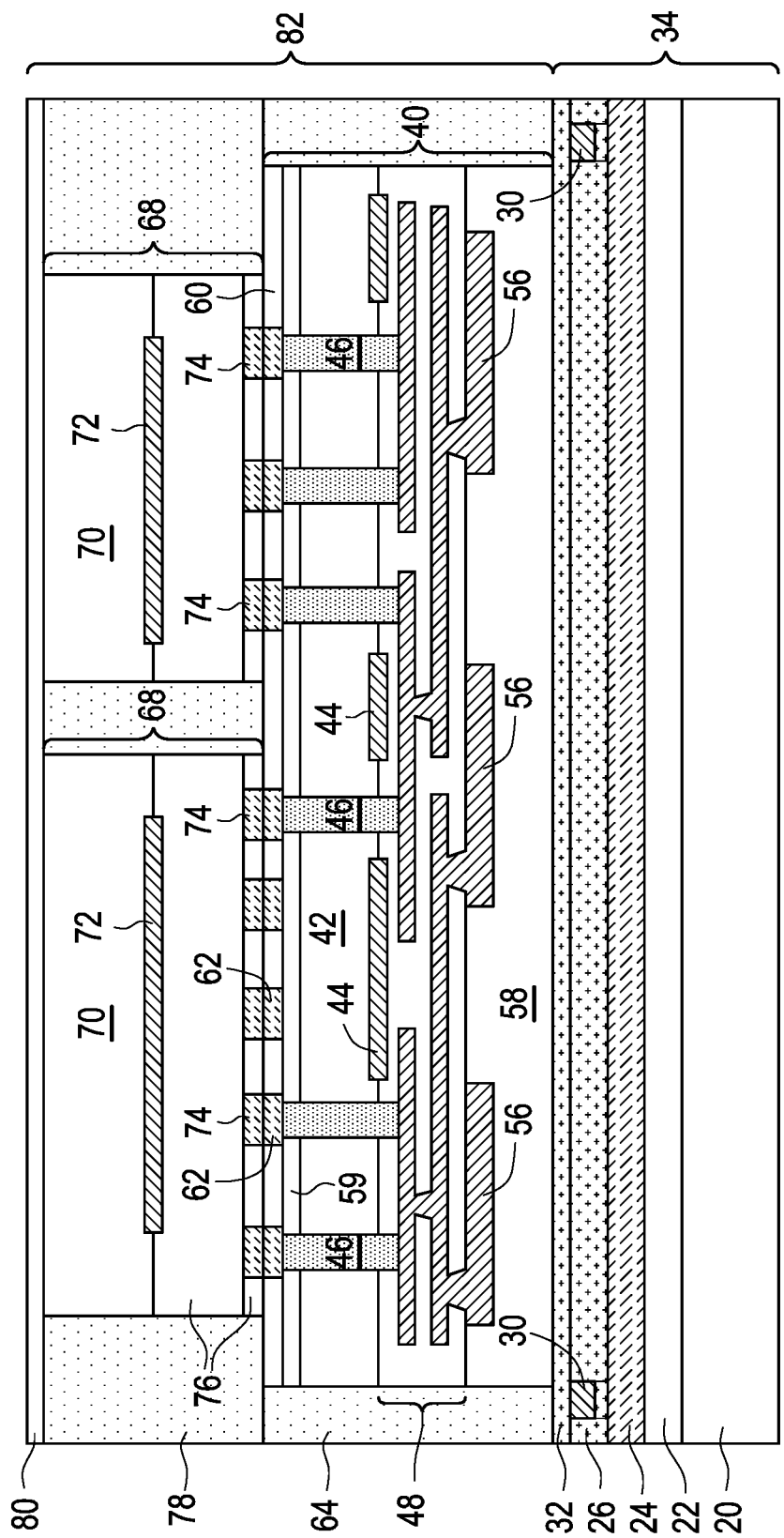

FIG. 12 illustrates the gap-filling of package components 68 in gap-filling regions 78. The respective process is illustrated as process 222 in the process flow 200 as shown in FIG. 34. Gap-filling regions 78 may be formed of or comprise a dielectric material(s) selected from the same group of candidate materials for forming gap-filling regions 64. For example, gap-filling regions 78 may comprise dielectric liners (such as SiN liners) and dielectric regions (such as $SiO_2$ regions) over the dielectric liners. Alternatively, gap-filling regions 78 may comprise a molding compound, an epoxy, a resin, and/or the like. A planarization process is performed to level the top surfaces of gap-filling regions 78 with the back surfaces of package components 68.

Referring to FIG. 12 again, bond layer 80 is deposited on top of gap-filling regions 78 and package components 68. In accordance with some embodiments, bond layer 80 is formed of a silicon-containing dielectric material, which may be selected from $SiO_2$, SiON, SiN, SiOCN, SiCN, SiOC, SiC, or the like. Throughout the description, the structure including package components 40 and 68, gap-filling regions 64 and 78, and bond layer 80 are collectively referred to as reconstructed wafer 82.

Figure 13:
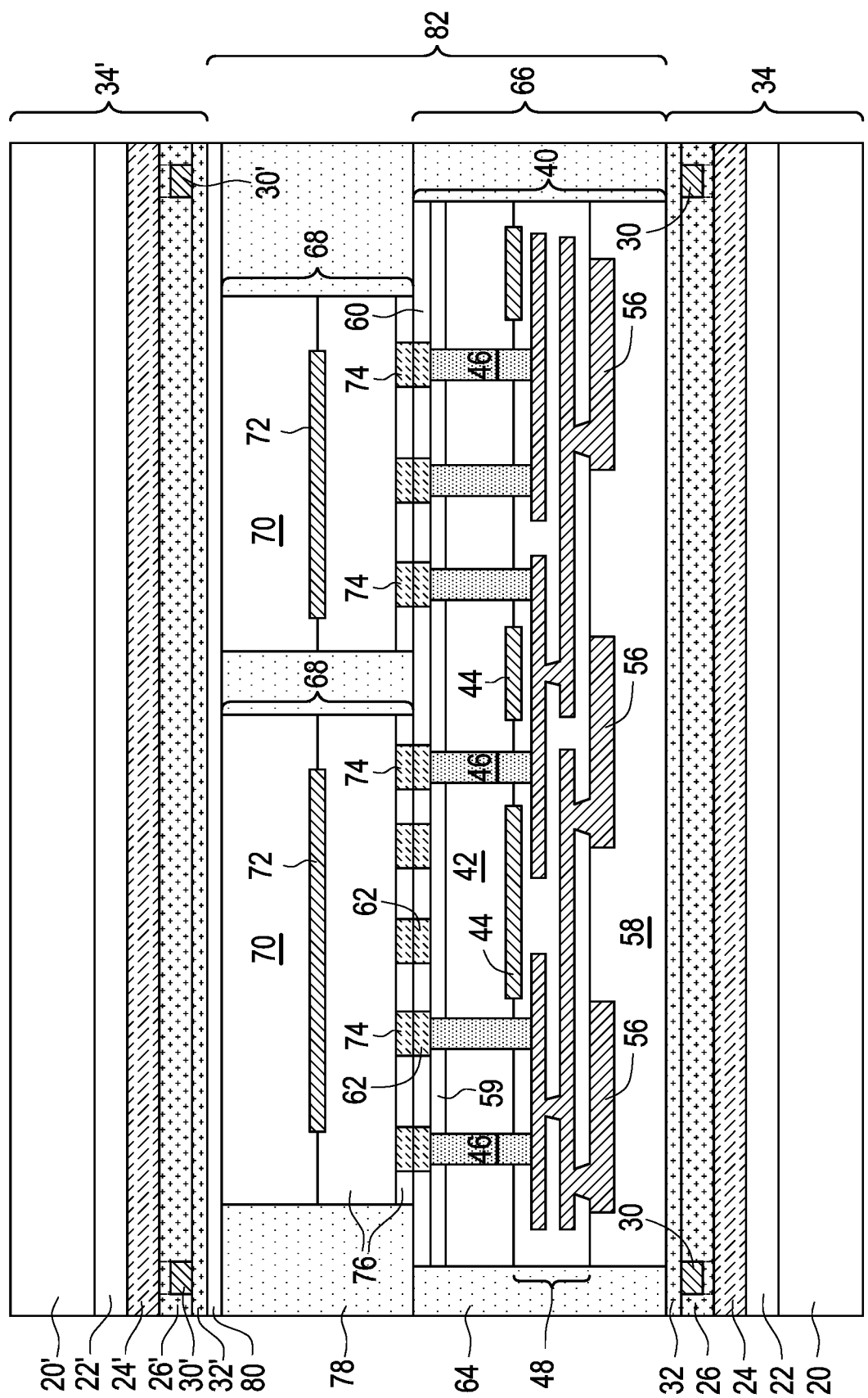

Referring to FIG. 13, composite carrier 34' is bonded to reconstructed wafer 82 through fusion bonding. The respective process is illustrated as process 224 in the process flow 200 as shown in FIG. 34. In accordance with some embodiments, composite carrier 34' has a similar (or identical) structure as composite carrier 34, and includes base carrier 20', layers 22', 24', and 26', and bond layer 32'. The materials of base carrier 20', layers 22', 24', and 26', and bond layer 32' may be selected from the candidate groups of materials of carrier 20, layers 22, 24, and 26, and bond layer 32, respectively. Accordingly, layers 24' 26', and bond layer 32' may be formed of or comprise similar materials. The materials of base carrier 20', layers 22', 24', and 26', and bond layer 32' may also be identical to the materials of carrier 20, layers 22, 24, and 26, and bond layer 32, respectively.

In accordance with alternative embodiments, composite carrier 34' has a different structure than composite carrier 34. For example, the materials of base carrier 20', layers 22', 24', and 26', and bond layer 32' may be selected from different candidate groups of materials than the corresponding base carrier 20, layers 22, 24, and 26, and bond layer 32. In accordance with some embodiments, layer 26' is formed of a material different from the materials of layer 24' and bond layer 32'. For example, layers 24', 26', and 32' may be formed of SiN, SiO$_2$, and SiON, respectively. Although this means that if composite carrier 34' needs five CMP processes to remove, with each of base carrier 20', layers 22', 24', and 26', and bond layer 32' needing one CMP process, when composite carrier 34' is not removed, this does not result in the increase in manufacturing cost.

Figure 14:
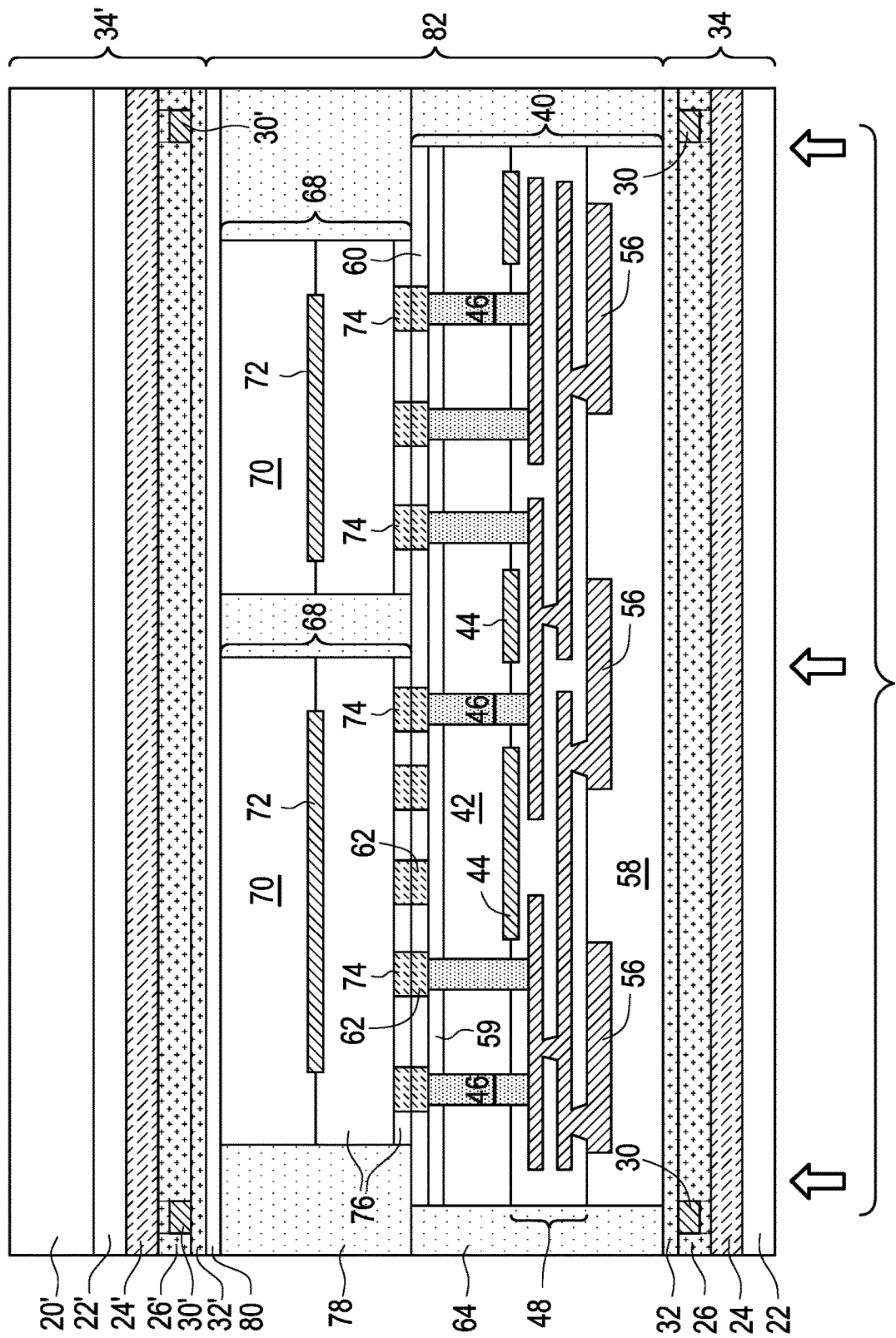
Figure 15:
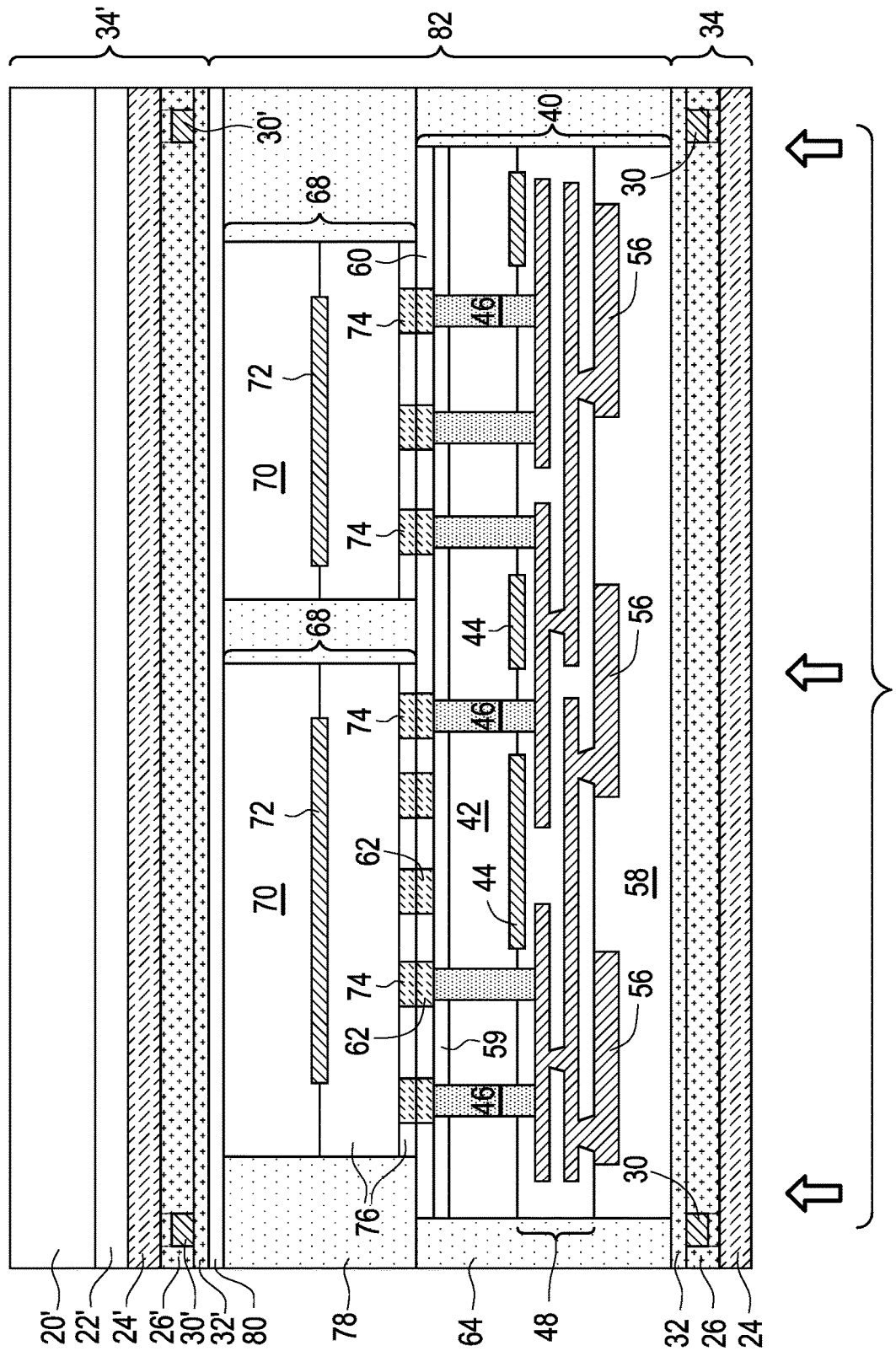
Figure 16:
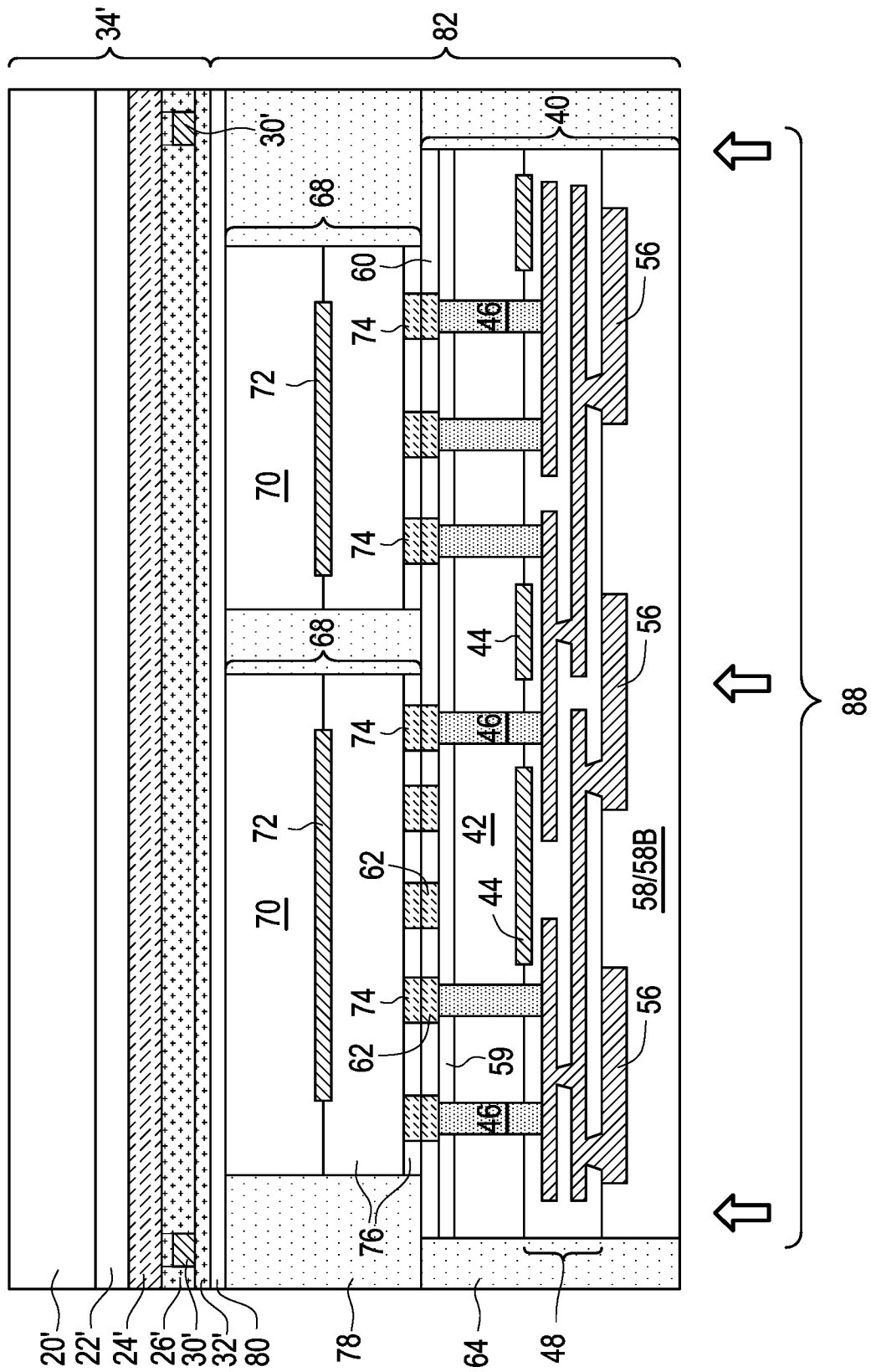

FIGS. 14, 15, and 16 illustrate three CMP processes for removing composite carrier 34. Referring to FIG. 14, a first CMP process 84 is performed to remove base carrier 20. The respective process is illustrated as process 226 in the process flow 200 as shown in FIG. 34. Layer 22 is formed of a material different from that of base carrier 20. Also, a suitable slurry is selected to have a significant greater CMP rate in removing base carrier 20 than the CMP rate for removing layer 22. Accordingly, the first CMP process 84 is stopped on layer 22. Next, referring to FIG. 15, a second CMP process 86 is performed to remove layer 22. The respective process is illustrated as process 228 in the process flow 200 as shown in FIG. 34. Layer 24 is formed of a material different from that of layer 22. Also, a suitable slurry is selected to have a significant greater CMP rate for removing layer 22 than the CMP rate for removing layer 24. Accordingly, the second CMP process 86 is stopped on layer 24.

Referring to FIG. 16, a third CMP process 88 is performed to remove layers 24 and 26, bond layer 32, and alignment marks 30. The respective process is illustrated as process 230 in the process flow 200 as shown in FIG. 34. Layers 24 and 26 and bond layer 32 are formed of similar materials, which are different from the material of bond layer 58. Also, a suitable slurry is selected to have a significant greater CMP rate in removing layers 24 and 26 and bond layer 32 than the CMP rate for removing dielectric bond layer 58, so that the third CMP process 88 is stopped on dielectric bond layer 58. The slurries used in the first CMP process, the second CMP process, and the third CMP process may be different from each other.

In accordance with some embodiments of the present disclosure, since layer 24 and 26 and bond layer 32 are formed of similar materials, three CMP processes are used to remove the composite carrier 34. This is different from the removal of conventional composite carriers, in which layer 26 is formed of a material different from the materials of layer 24 and bond layer 32. Accordingly, in the removal of a conventional composite carrier, each of layers 24, 26, and 32 needs an individual CMP process to remove, and five CMP processes in total are needed.

In above-discussed example embodiments, dielectric bond layer 58 may be a single layer formed of a homogeneous material, which is left unremoved in the third CMP process. In accordance with alternative embodiments, dielectric bond layer 58 includes lower layer 58A acting as the bond layer, and upper layer 58B for stopping the third CMP process. Lower layer 58A is formed of a material similar to the material of bond layer 32. Upper layer 58B is formed of a material different from the materials of lower layer 58A and layers 24, 26, and 32. Accordingly, in the third CMP process, lower layer 58A is also removed to reveal the upper layer 58B. The resulting structure is also similar to the structure shown in FIG. 16.

Figure 17:
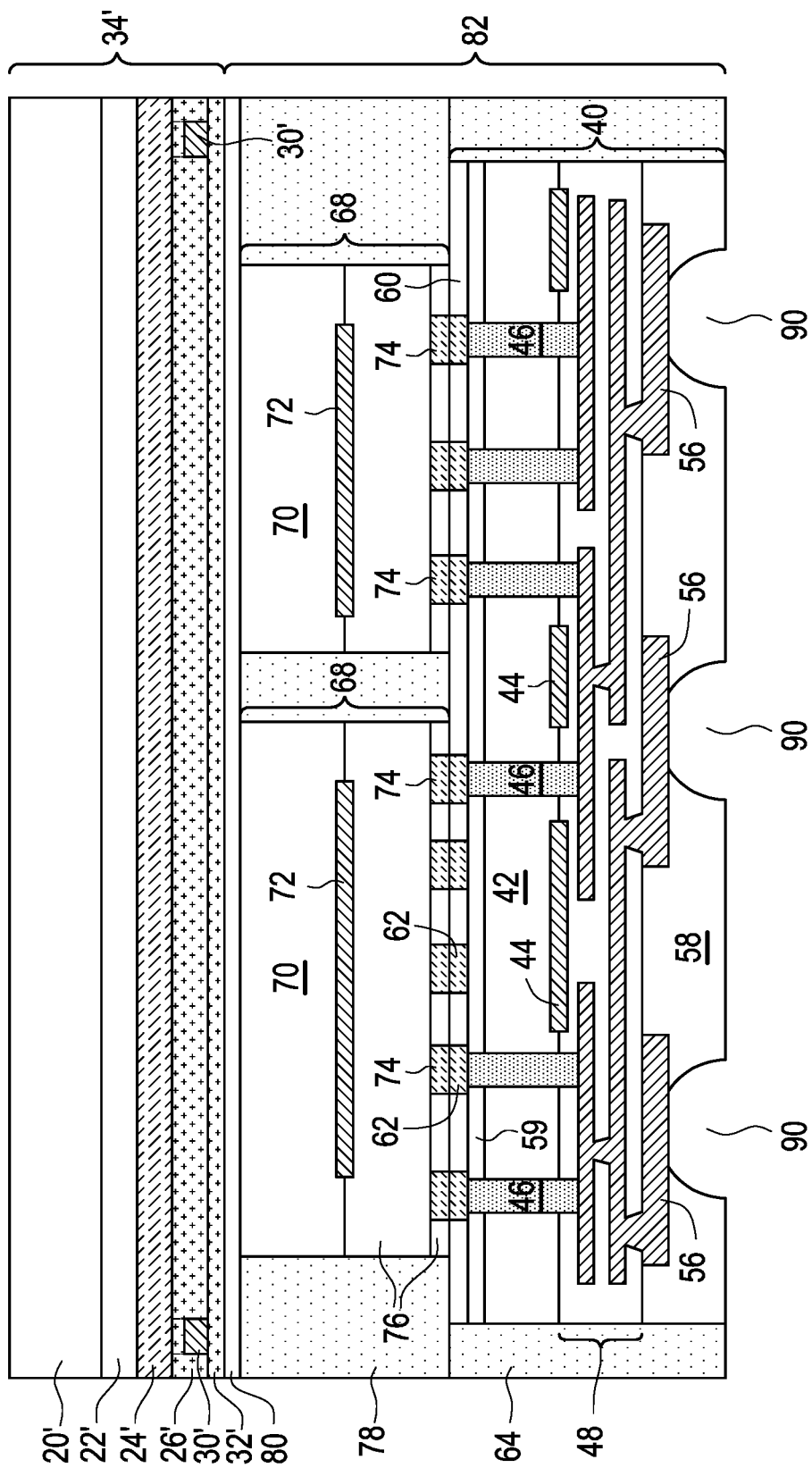

FIG. 17 illustrates a pad-opening process, in which openings 90 are formed in dielectric bond layer 58 to reveal bond pads 56. The respective process is illustrated as process 232 in the process flow 200 as shown in FIG. 34. In accordance with some embodiments, openings 90 are formed through a photo lithography process, and dielectric bond layer 58 is etched to form openings 90, with metal pads 56 being exposed to openings 90.

Figure 18:
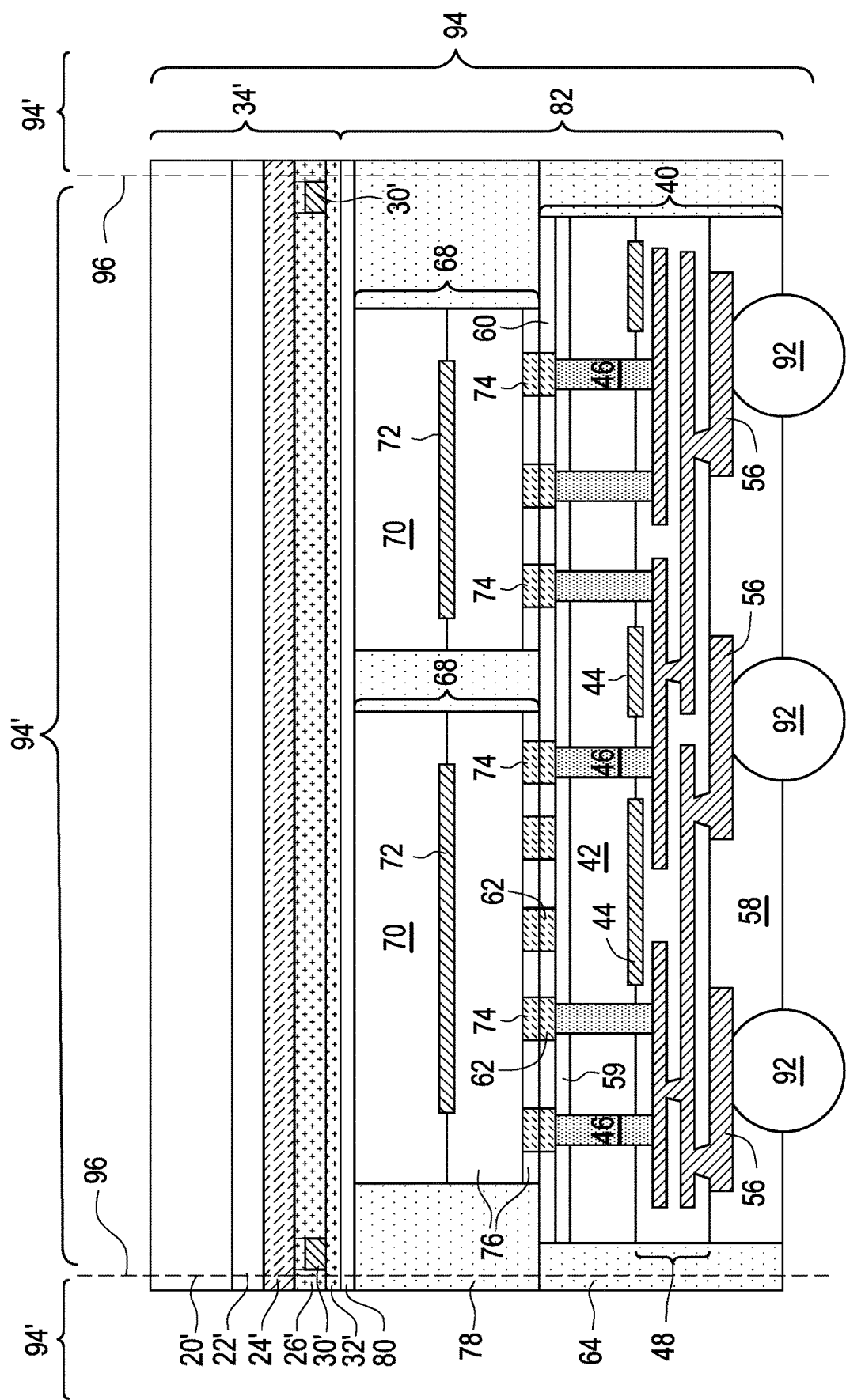

FIG. 18 illustrates the formation of electrical connectors 92. The respective process is illustrated as process 234 in the process flow 200 as shown in FIG. 34. In accordance with some embodiments, electrical connectors 92 comprise solder regions, which may be formed by placing solder balls into openings 90, and then reflowing the solder balls as solder regions. In accordance with alternative embodiments, electrical connectors 92 comprise metal posts, which may be formed through plating.

The structure shown in FIG. 18 is referred to as reconstructed wafer 94. A singulation process may be performed to saw reconstructed wafer 94 along scribe lines 96 and to form discrete packages 94', which are identical to each other. The respective process is illustrated as process 236 in the process flow 200 as shown in FIG. 34. Each of the discrete packages 94' includes a portion of composite carrier 34'. In accordance with alternative embodiments, before the singulation process, composite carrier 34' is removed. The removal may be performed through three CMP processes. Base carrier 20' and layer 22' may be removed in a first CMP process and a second CMP process, respectively. Layers 24', 26', 32' may be removed in a third CMP process. Bond layer 80 may be, or may not be, removed by the third CMP process.

Figure 19:
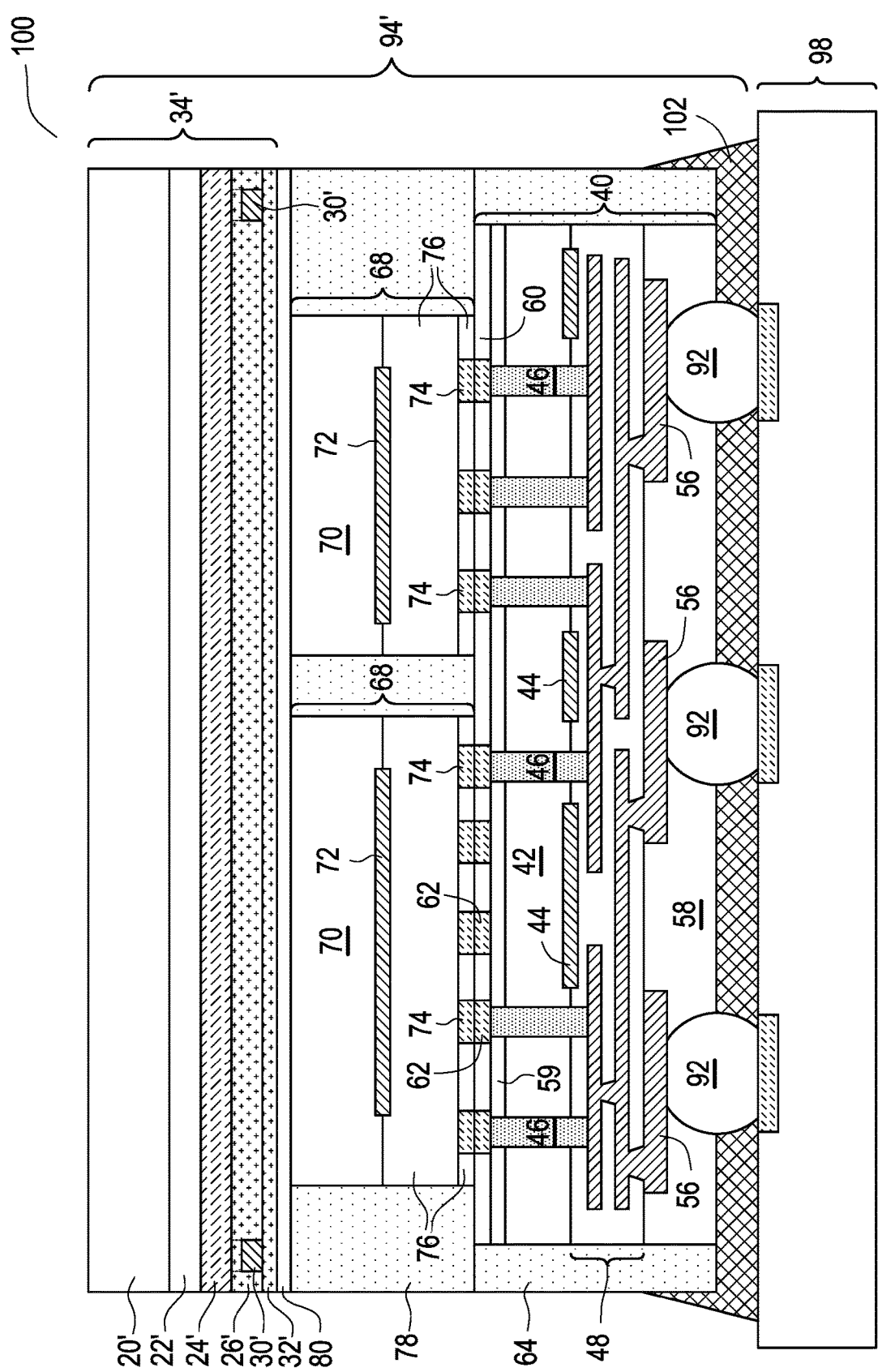

FIG. 19 illustrates the bonding of package 94' to package component 98, so that package 100 is formed. The respective process is illustrated as process 238 in the process flow 200 as shown in FIG. 34. Package component 98 may be a package substrate, an interposer, a package, or the like. Underfill 102 is dispensed between package 94' and package component 98. In accordance with some embodiments, package 100 includes a piece of composite carrier 34'. In accordance with some embodiments in which the package components 40 (FIG. 18) are parts of an unsawed wafer, in the resulting package 100, there is no gap-filling region 64, and the edges of package component 40 are parts of the edges of the package 100. It is appreciated that the piece of composite carrier 34' may not include alignment marks 30 since alignment marks 30 may have been removed in the singulation process. In accordance with alternative embodiments in which composite carrier 34' has been removed, the top surfaces of substrates 70 may be revealed.

FIGS. 20, 21, 22A, 22B, 22C, and 23-27 illustrate cross-sectional views of intermediate stages in the formation of a package in accordance with alternative embodiments of the present disclosure. These embodiments are similar to the embodiments as shown in preceding processes, except in each package, instead of having two tier-2 package components 68 bonded to the same tier-1 package components 40, two tier-2 package components 68 are bonded to two tier-1 package components 40. Unless specified otherwise, the materials, the structures, and the formation processes of the components in these embodiments are essentially the same as the like components, which are denoted by like reference numerals in the preceding embodiments. The details regarding the formation process, the structures, and the materials of the components shown in FIGS. 20, 21, 22A, 22B, 22C, and 23-27 (and in subsequently discussed FIGS. 28, 29A, 29B, and 30-33) may thus be found in the discussion of the preceding embodiments.

Figure 20:
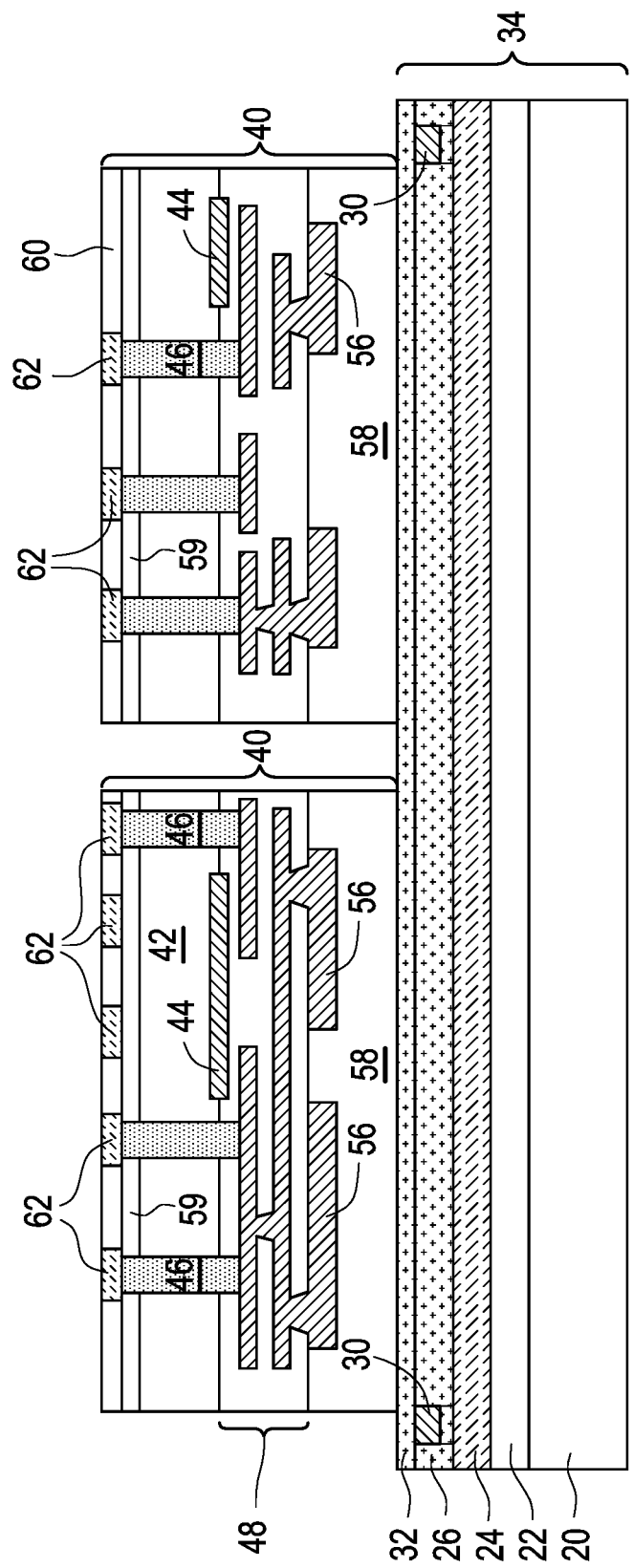
FIGS. 20, 21, 22A, 22B, 22C, and 23-27 illustrate the cross-sectional views and perspective views of intermediate stages in the formation of a composite carrier and a package in accordance with some embodiments.
Figure 21:
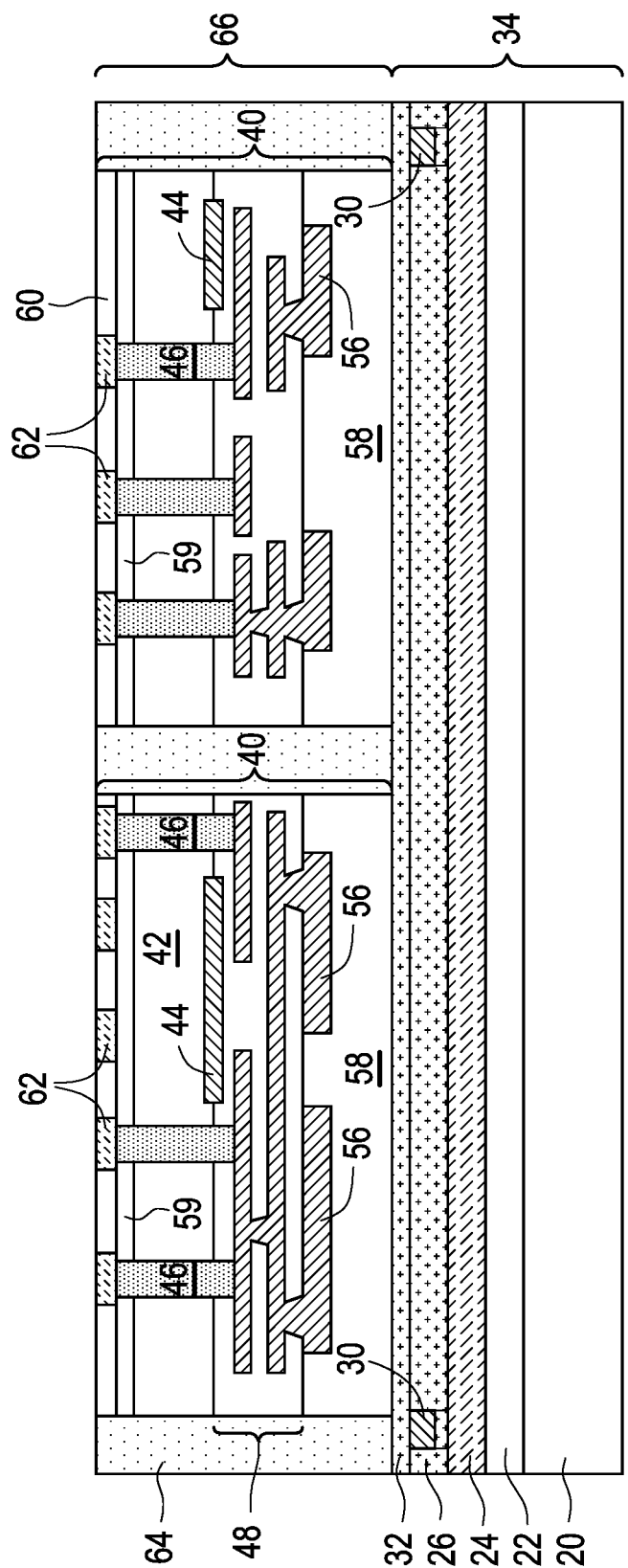

The initial steps of these embodiments are essentially the same as shown in FIGS. 1 through 7, in which composite carrier 34 is formed. Next, as shown in FIG. 20, a plurality of tier-1 package components 40 are bonded to composite carrier 34 through fusion bonding. The structures of package components 40 are essentially the same as discussed referring to FIG. 8, and are not repeated herein. Next, as shown in FIG. 21, gap-filing regions 64 are formed. Reconstructed wafer 66 is thus formed.

Figure 22A:
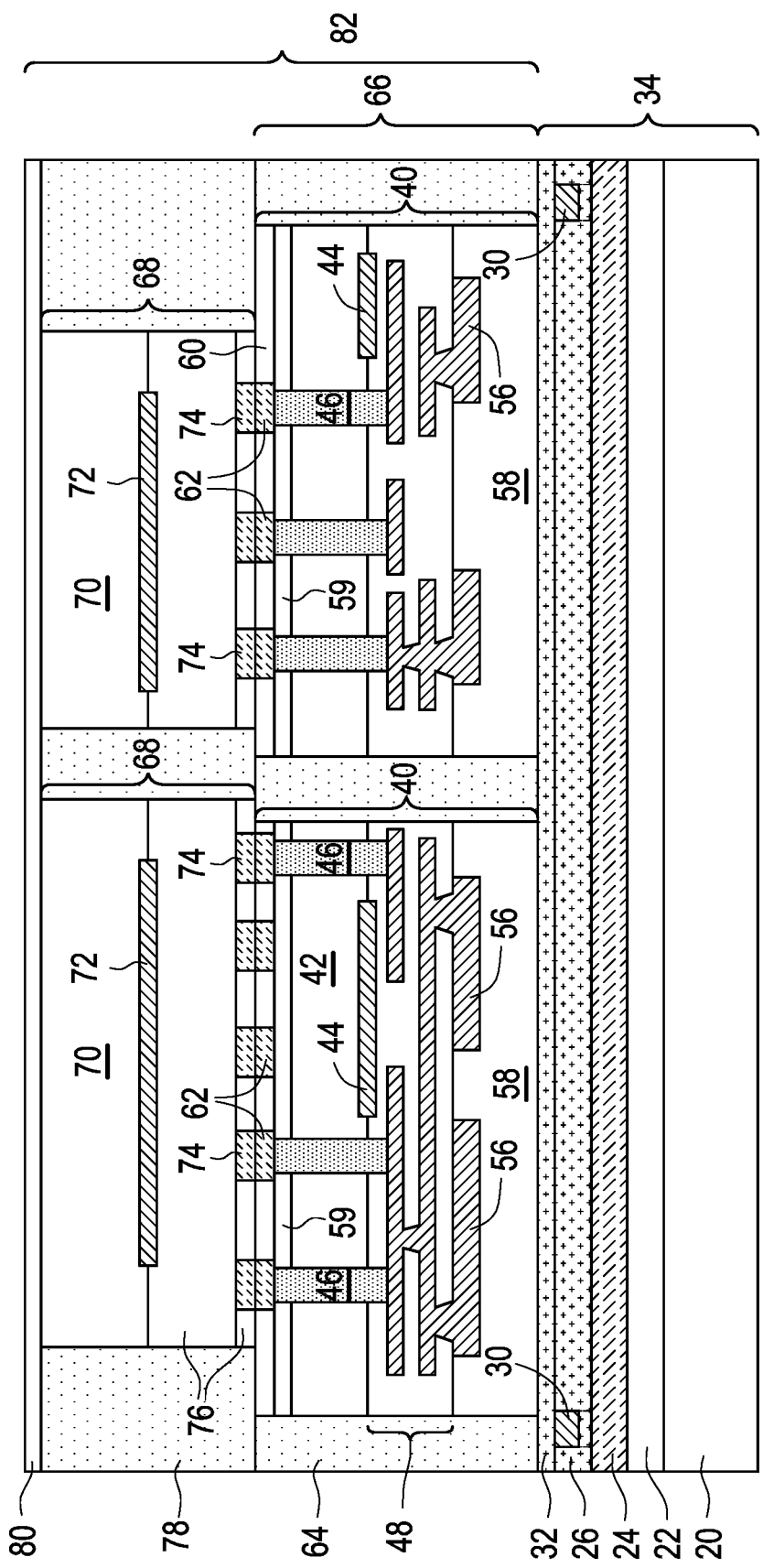
Figure 22C:
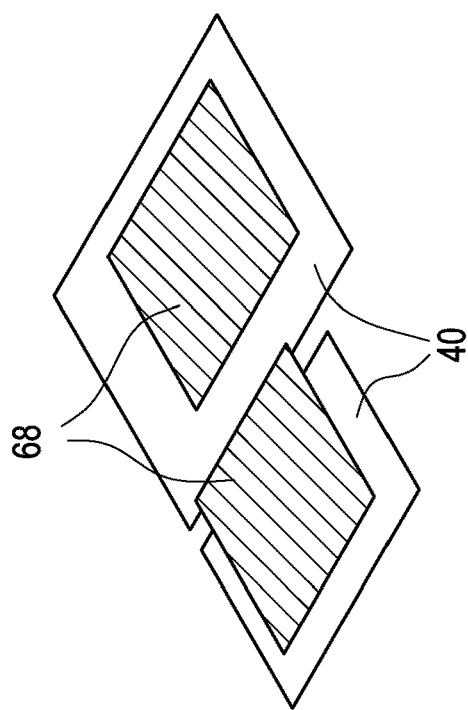
Figure 22B:
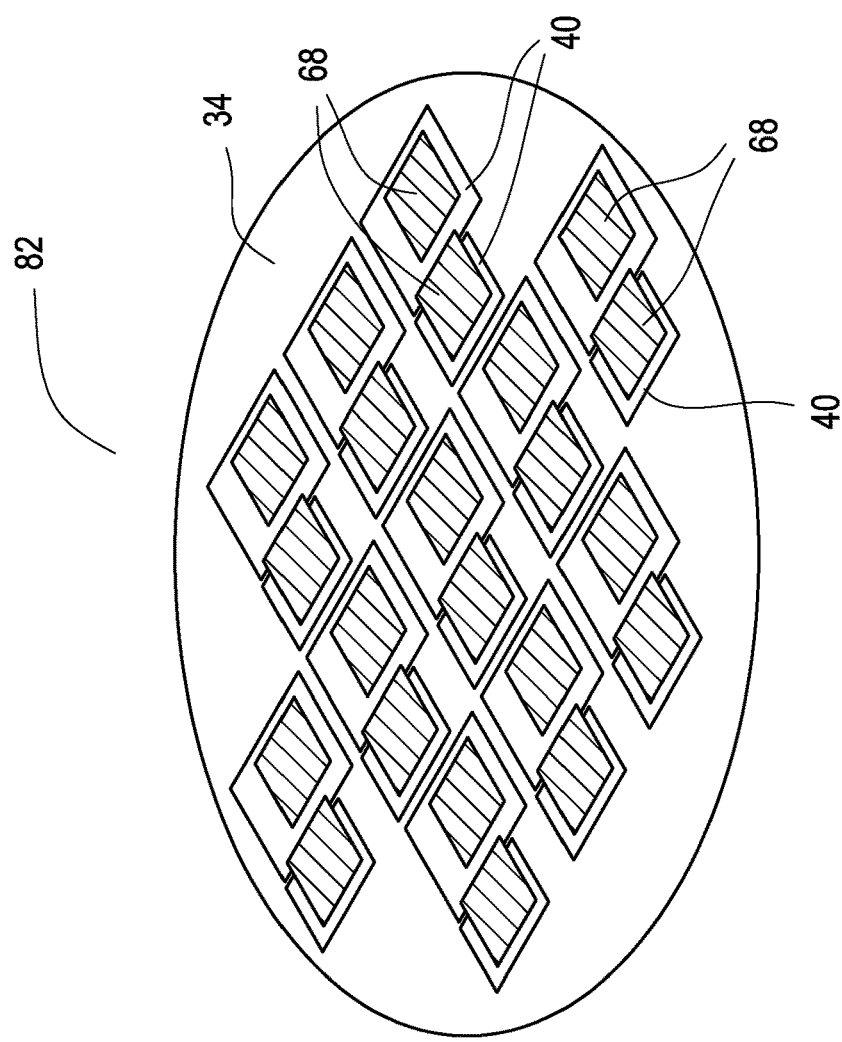

FIG. 22A illustrates the bonding of tier-2 package components 68 to the underlying tier-1 package components 40. Gap-filling regions 78 are then formed, followed by the formation of bond layer 80. Reconstructed wafer 82 is thus formed. FIG. 22B illustrates a perspective view illustrating composite carrier 34, a plurality of tier-1 package components 40, and a plurality of package components 68, each being bonded to the underlying package component 40. FIG. 22C illustrates an amplified view of one group of tier-1 package components 40 and the corresponding tier-2 package components 68 bonded thereon.

Figure 23:
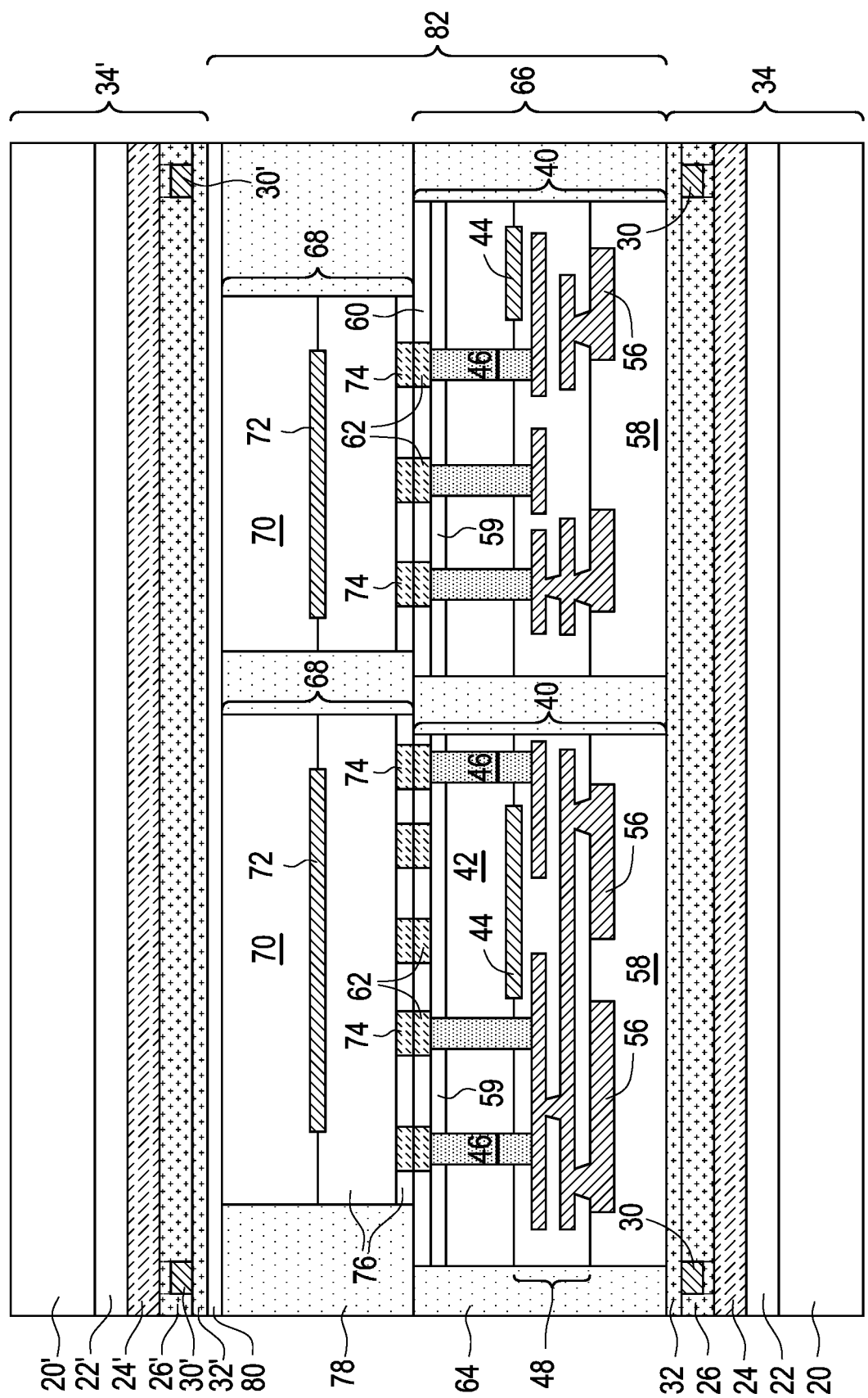
Figure 24:
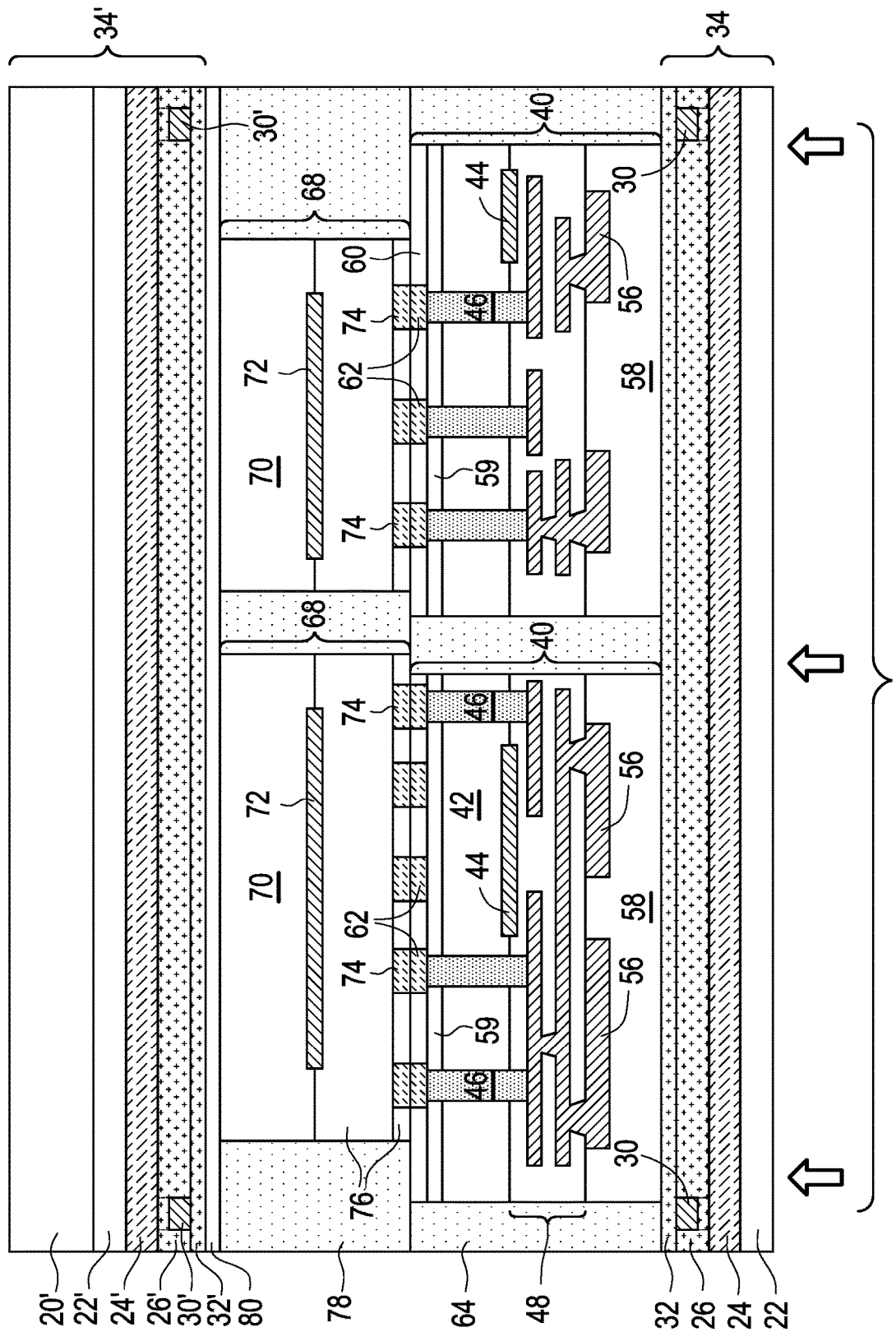
Figure 25:
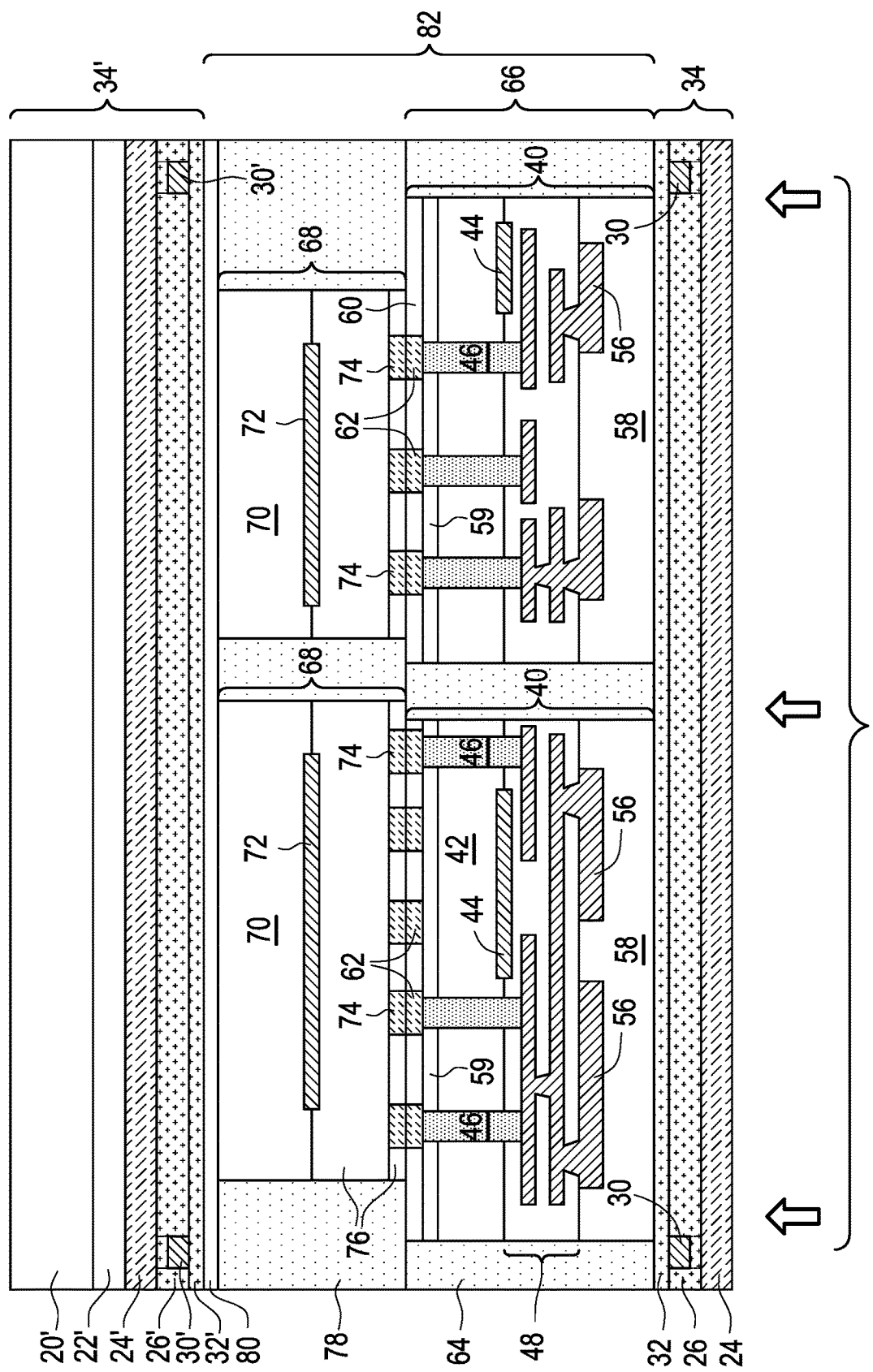
Figure 26:
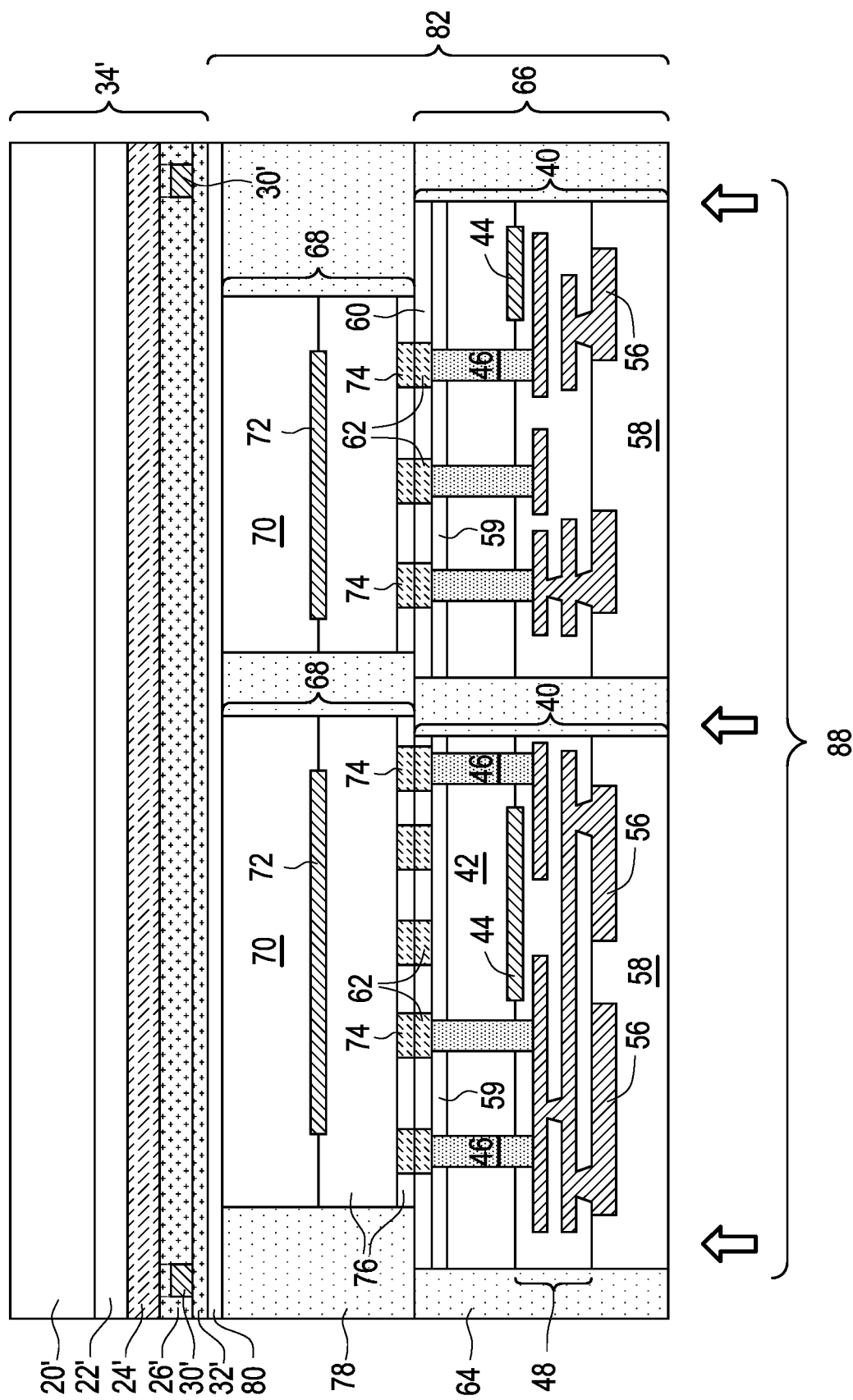
Figure 27:
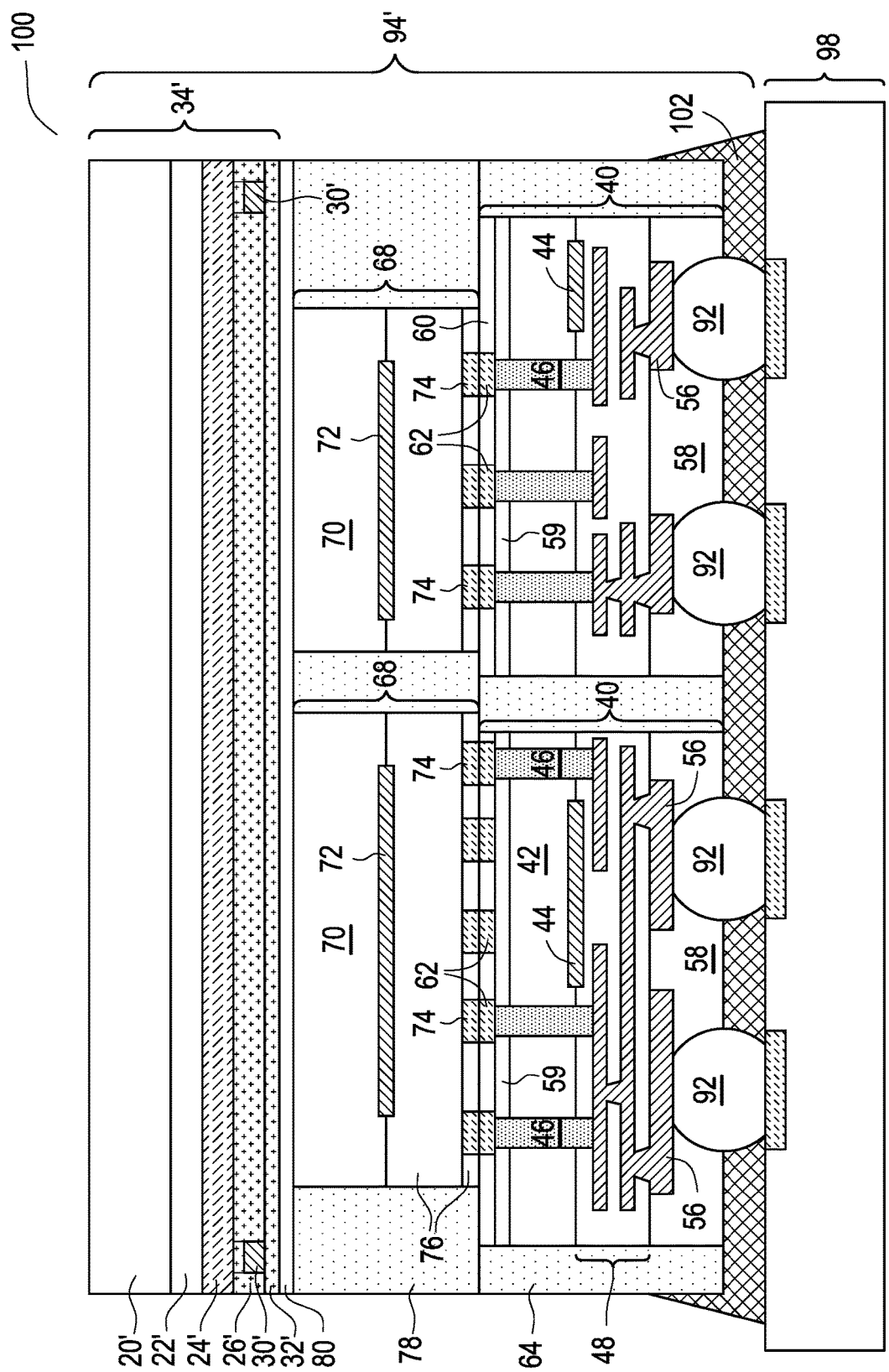

FIGS. 23 through 27 illustrate the remaining process for forming package 100 in accordance with some embodiments. The details of these processes and the corresponding components may be found referring to the processes shown in FIGS. 13-19, and the details are not repeated herein. FIG. 23 illustrates the bonding of composite carrier 34' to reconstructed wafer 82. FIGS. 24, 25, and 26 illustrate three CMP processes 84, 86, and 88, respectively, for removing composite carrier 34. FIG. 27 illustrates the resulting package 100.

FIGS. 28, 29A, 29B, and 30-33 illustrate the cross-sectional views and a perspective view of intermediate stages in the formation of a package in accordance with some embodiments of the present disclosure. These embodiments are similar to the embodiments as shown in preceding processes, except that tier-1 and tier-2 package components are wafer-level package components, and no composite carrier is bonded to tier-2 package components.

Figure 28:
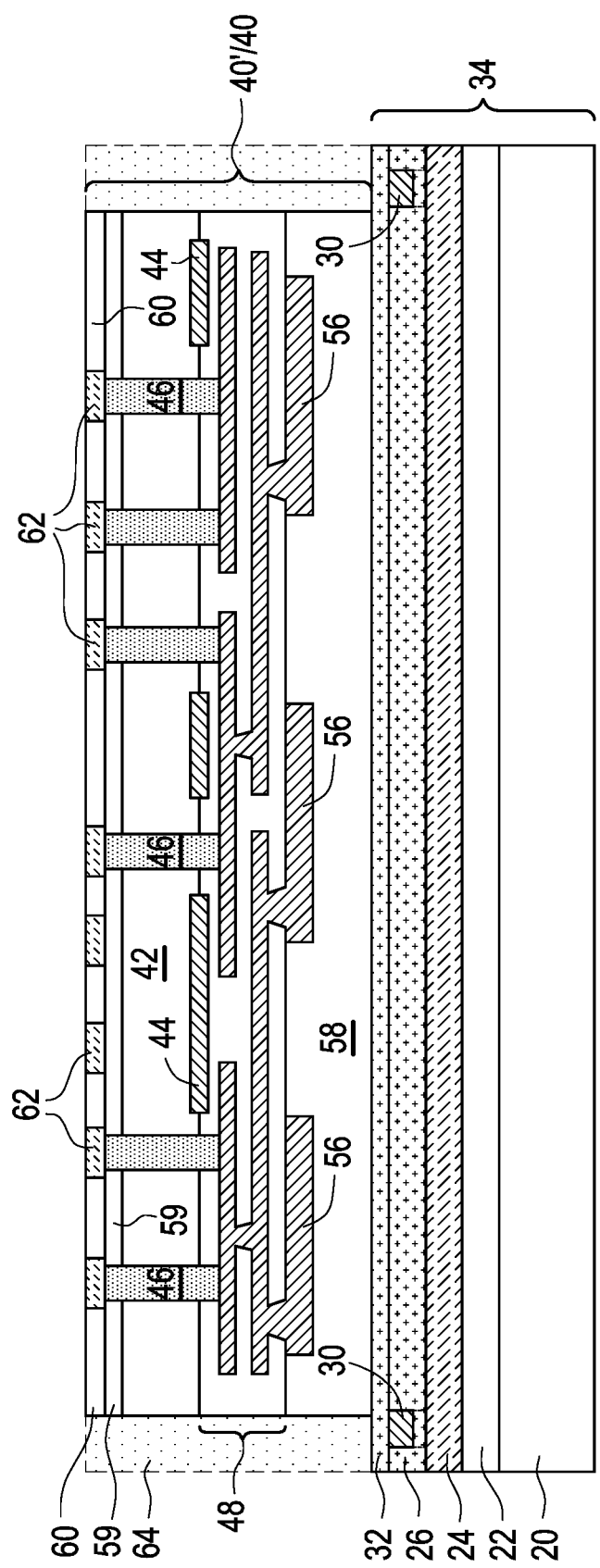
FIGS. 28, 29A, 29B, and 30-33 illustrate the cross-sectional views and a perspective view of intermediate stages in the formation of a composite carrier and a package in accordance with some embodiments.

The initial steps of these embodiments are essentially the same as shown in FIGS. 1 through 7, in which composite carrier 34 is formed. Next, as shown in FIG. 28, wafer 40' is bonded to composite carrier 34 through a wafer-to-wafer bonding, which is also through fusion bonding. Wafer 40' comprises a plurality of package components 40 therein, which are identical to each other, and package components 40 may be device dies in accordance with some embodiments. FIG. 28 illustrates one of the package components 40 to represent wafer 40'. In accordance with some embodiments, there is no gap-filling region surrounding wafer 40. In accordance with alternative embodiments, a gap-filling region 64 is formed to surround wafer 40'. Accordingly, gap-filling region 64 is shown as being dashed to represent that it may or may not be formed.

Figure 29A:
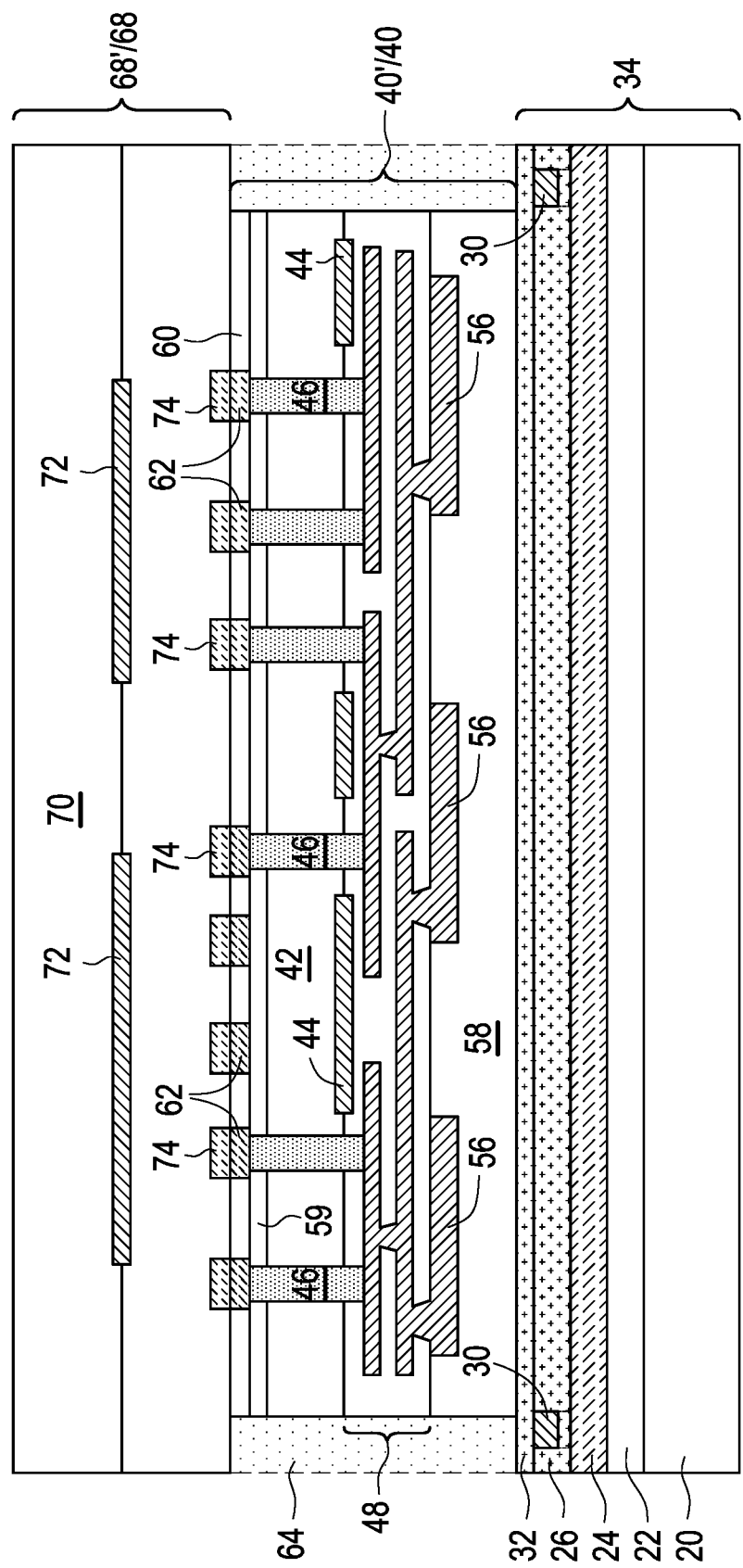
Figure 29B:
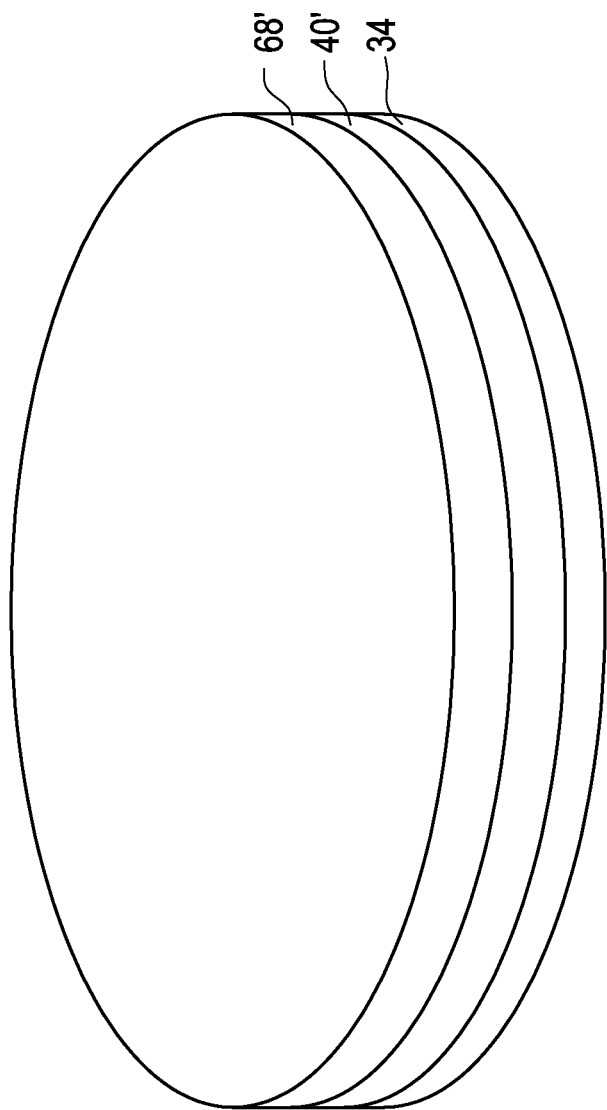

FIG. 29A illustrates the bonding of wafer 68' to wafer 40'. In accordance with some embodiments, the bonding is through hybrid bonding. Wafer 68' may be an un-sawed device wafer or a reconstructed wafer having discrete device dies packaged therein. Wafer 68' includes a plurality of identical package components 68. FIG. 29B illustrates a perspective view showing composite carrier 34, wafer 40', and wafer 68'.

Figure 30:
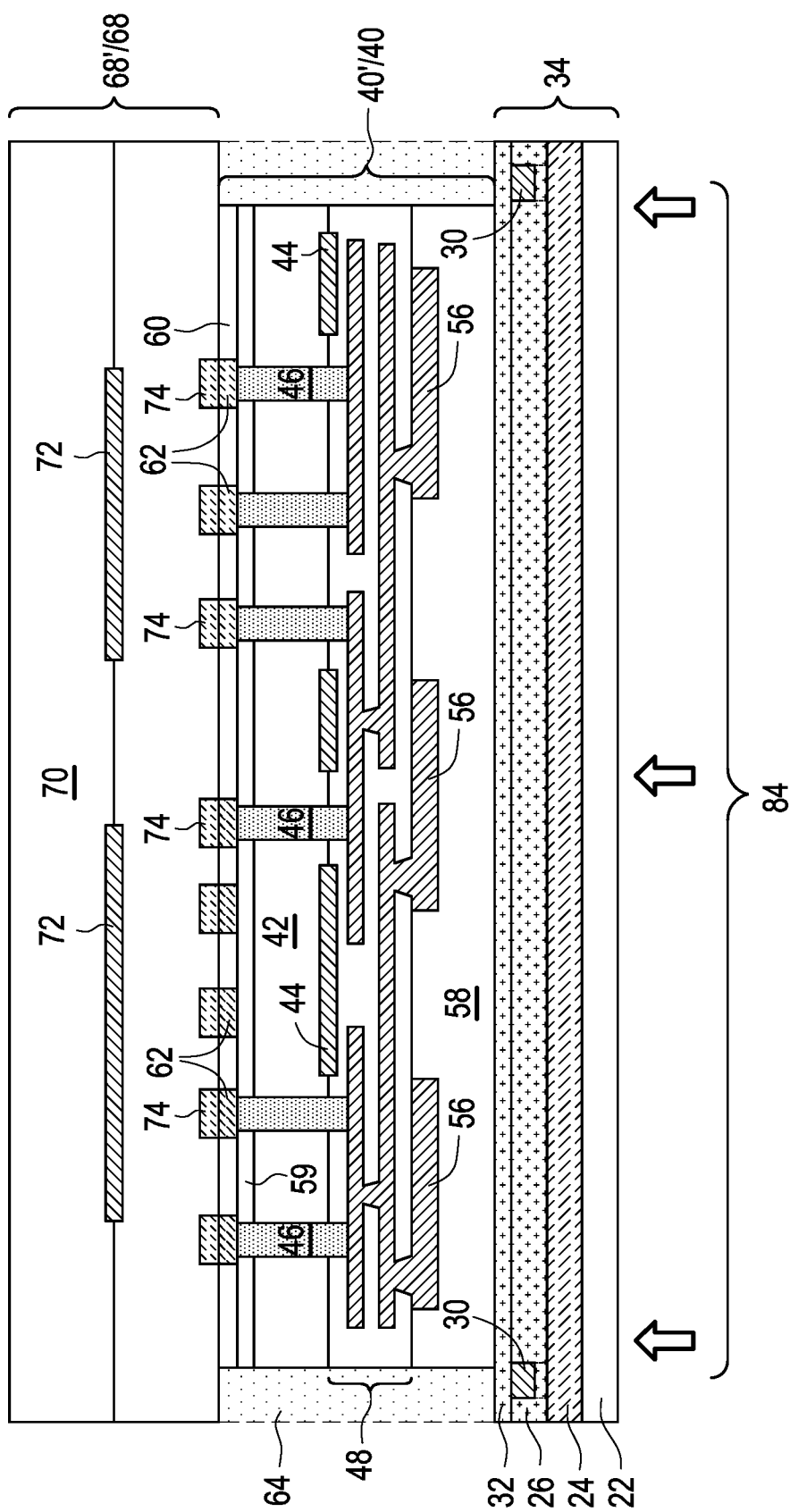
Figure 31:
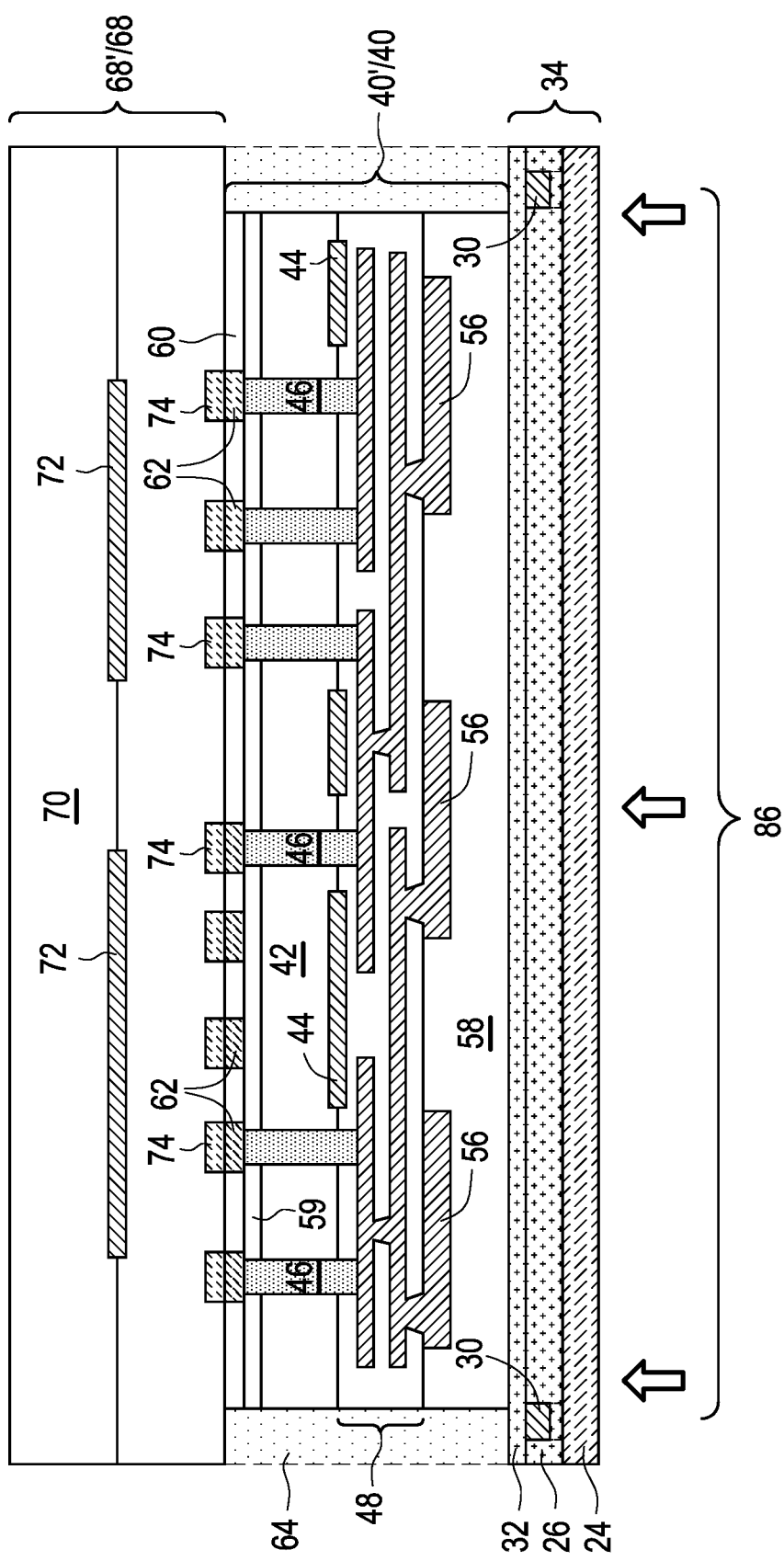
Figure 32:
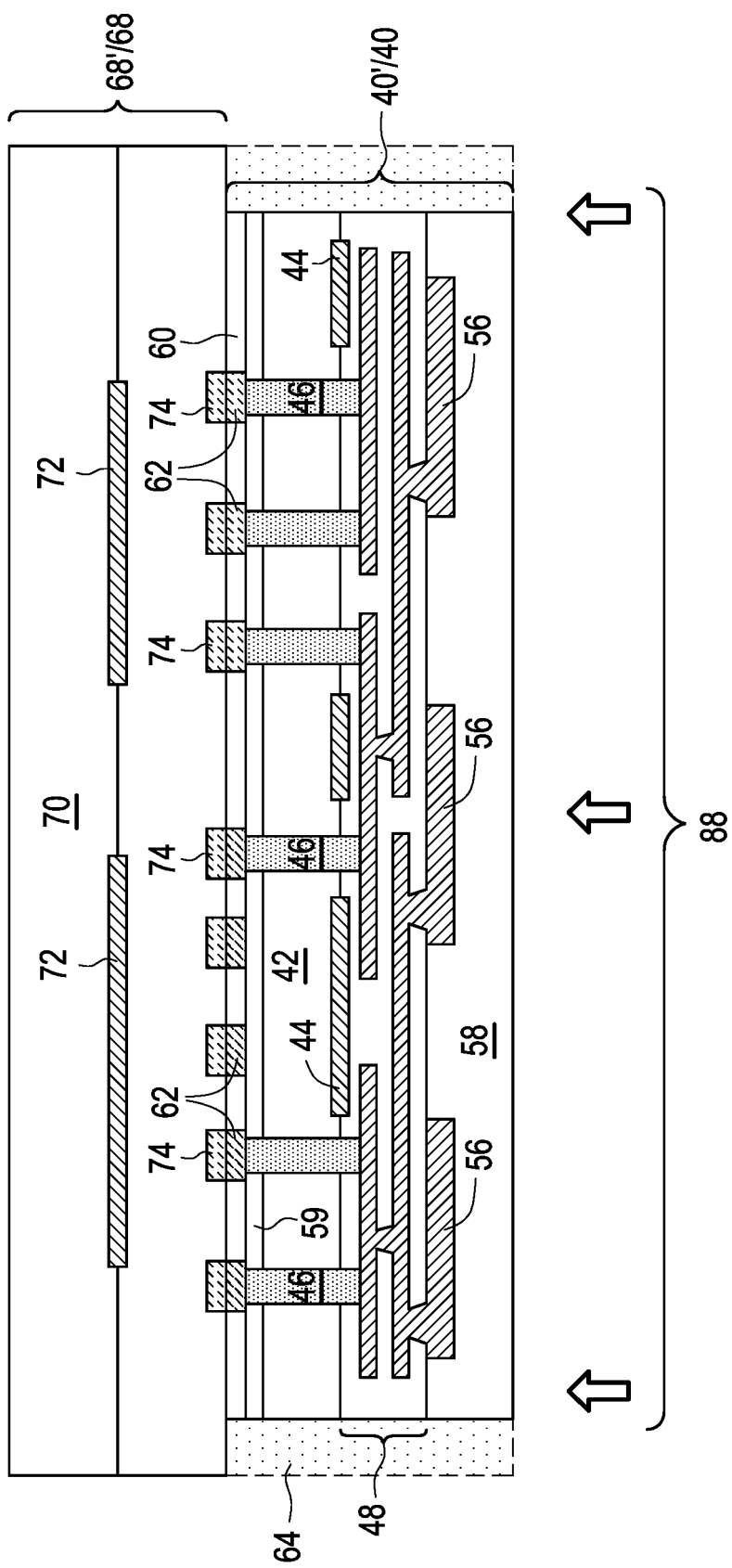
Figure 33:
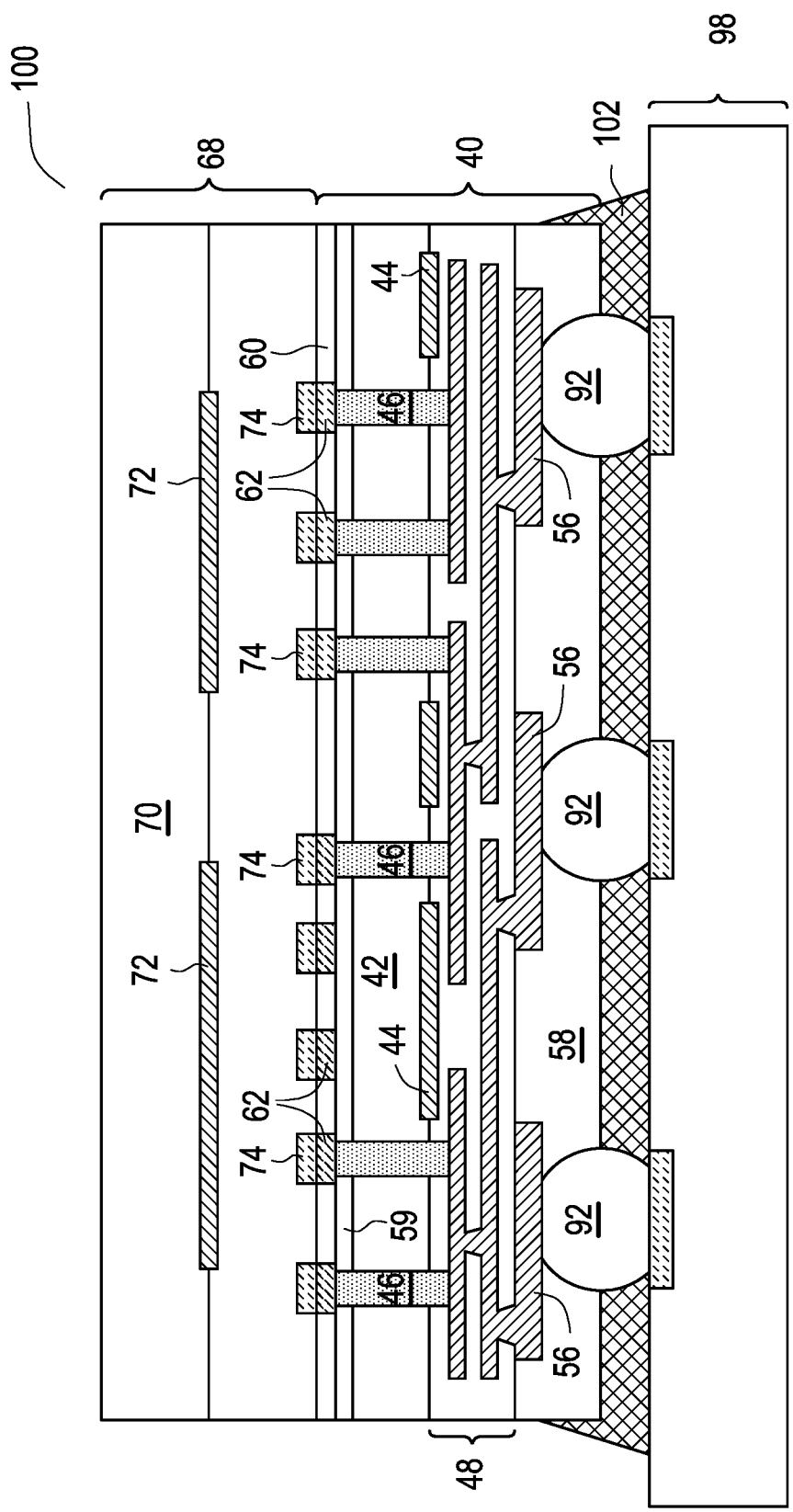

FIGS. 30 through 33 illustrate the remaining process for forming package 100 in accordance with some embodiments. The details of these processes and the corresponding components may be found referring to the processes as shown in FIGS. 13-19, and the details are not repeated herein. FIGS. 30, 31, and 32 illustrate three CMP processes 84, 86, and 88, respectively, for removing composite carrier 34. The details of the CMP processes 84, 86, and 88 have been discussed in preceding discussed embodiments, and are not repeated herein. FIG. 33 illustrates the resulting package 100.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Some layers of the composite carrier are formed using similar materials that are different from the material of the bond layer in another package component, to which the reconstructed wafer is bonded. Accordingly, these layers of the composite carrier may be removed in a same CMP process. The manufacturing cost is thus reduced. The materials of these layers, while being similar, may also have some difference from each other to suit to different requirements such as improved CMP stopping ability and improved bond strength.

In accordance with some embodiments of the present disclosure, a method comprises bonding a first package component on a first composite carrier; performing a first polishing process on the first composite carrier to remove a base carrier of the first composite carrier, wherein the first polishing process stops on a first layer of the first composite carrier; performing a second polishing process to remove the first layer of the first composite carrier, wherein the second polishing process stops on a second layer of the first composite carrier; and performing a third polishing process to remove a plurality of layers in the first composite carrier, wherein the plurality of layers comprise the second layer, and wherein the third polishing process stops on a dielectric layer in the first package component. In an embodiment, the plurality of layers removed by the third polishing process comprise three layers. In an embodiment, the third polishing process comprises removing the second layer; removing a third layer and an alignment mark in the third layer; and removing a fourth layer that is physically bonded to the first package component. In an embodiment, the third layer and the fourth layer are formed of a same material different from a material of the second layer, and the third polishing process is performed using a same slurry to remove the second layer, the third layer, and the fourth layer. In an embodiment, each of the first polishing process, the second polishing process, and the third polishing process comprises a chemical mechanical polish process. In an embodiment, the method further comprises encapsulating the first package component in a first encapsulant, wherein the first encapsulant contacts a sidewall of the dielectric layer in the first package component, and wherein the third polishing process reveals the first encapsulant. In an embodiment, the method further comprises bonding a second package component on the first package component; bonding a second composite carrier over the second package component; and sawing the second composite carrier to form a package, wherein the package comprises the first package component, the second package component, and a piece of the second composite carrier therein. In an embodiment, the second composite carrier is identical to the first composite carrier. In an embodiment, the second composite carrier and the first composite carrier have different structures. In an embodiment, the method further comprises bonding a device wafer on the first package component; and after the third polishing process, sawing the device wafer to form a package, wherein the package comprises the first package component and a device die in the device wafer.

In accordance with some embodiments of the present disclosure, a structure includes a composite carrier comprising a silicon base carrier; an oxide-based layer over the silicon base carrier; a first nitride-based layer over the oxide-based layer; a second nitride-based layer over the first nitride-based layer; and a third nitride-based layer over the second nitride-based layer. A first material of the first nitride-based layer is different from a second material of the second nitride-based layer and a third material of the third nitride-based layer. In an embodiment, each of the silicon base carrier, the oxide-based layer, the first nitride-based layer, and the third nitride-based layer is a homogeneous layer. In an embodiment, the structure further comprises an alignment mark in the second nitride-based layer. In an embodiment, the alignment mark extends from a top surface of the second nitride-based layer to an intermediate level between the top surface and a bottom surface of the second nitride-based layer. In an embodiment, the alignment mark penetrates through the second nitride-based layer. In an embodiment, the first nitride-based layer, the second nitride-based layer, and the third nitride-based layer have distinguishable interfaces in between. In an embodiment, the structure further comprises a package component comprising a surface dielectric layer bonding to the third nitride-based layer, wherein the surface dielectric layer and the oxide-based layer are formed of a same dielectric material.

In accordance with some embodiments of the present disclosure, a structure comprises a composite carrier, which comprises a base carrier; a silicon oxide layer over and contacting the base carrier; a silicon nitride layer over and contacting the silicon oxide layer; a first silicon oxynitride layer over and contacting the silicon nitride layer; and a second silicon oxynitride layer over and contacting the first silicon oxynitride layer. The structure further includes a package component over and bonding to the composite carrier, wherein the package component comprises a second silicon oxide layer bonding to the second silicon oxynitride layer. In an embodiment, the package component further comprises a semiconductor substrate spaced apart from the silicon oxide layer. In an embodiment, the package component further comprises a semiconductor substrate in physical contact with the silicon oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first package component on a first composite carrier;
    performing a first polishing process on the first composite carrier to remove a base carrier of the first composite carrier, wherein the first polishing process stops on a first layer of the first composite carrier;
    performing a second polishing process to remove the first layer of the first composite carrier, wherein the second polishing process stops on a second layer of the first composite carrier; and
    performing a third polishing process to remove a plurality of layers in the first composite carrier, wherein the plurality of layers comprise the second layer, and wherein the third polishing process stops on a dielectric layer in the first package component.

2. The method of claim 1, wherein each of the first polishing process, the second polishing process, and the third polishing process comprises a chemical mechanical polish process.

3. The method of claim 1 further comprising:
    encapsulating the first package component in a first encapsulant, wherein the first encapsulant contacts a sidewall of the dielectric layer in the first package component, and wherein the third polishing process reveals the first encapsulant.

4. The method of claim 1 further comprising:
    bonding a device wafer on the first package component; and
    after the third polishing process, sawing the device wafer to form a package, wherein the package comprises the first package component and a device die in the device wafer.

5. The method of claim 1, wherein the plurality of layers removed by the third polishing process comprise three layers.

6. The method of claim 5, wherein the third polishing process comprises:
    removing the second layer;
    removing a third layer and an alignment mark in the third layer; and
    removing a fourth layer that is physically bonded to the first package component.

7. The method of claim 6, wherein the third layer and the fourth layer are formed of a same material different from a material of the second layer, and the third polishing process is performed using a same slurry to remove the second layer, the third layer, and the fourth layer.

8. The method of claim 1 further comprising:
    bonding a second package component on the first package component;
    bonding a second composite carrier over the second package component; and
    sawing the second composite carrier to form a package, wherein the package comprises the first package component, the second package component, and a piece of the second composite carrier therein.

9. The method of claim 8, wherein the second composite carrier is identical to the first composite carrier.

10. The method of claim 8, wherein the second composite carrier and the first composite carrier have different structures.

11. A method comprising:
forming a composite carrier comprising:
depositing an oxide-based layer over a silicon base carrier;
depositing a first nitride-based layer over the oxide-based layer;
depositing a second nitride-based layer over the first nitride-based layer; and
depositing a third nitride-based layer over the second nitride-based layer, wherein a first material of the first nitride-based layer is different from a second material of the second nitride-based layer and a third material of the third nitride-based layer;
bonding a package component over the third nitride-based layer;
performing a first polishing process to remove the silicon base carrier;
performing a second polishing process to remove the oxide-based layer; and
performing a third polishing process to remove the first nitride-based layer, the second nitride-based layer, and the third nitride-based layer, wherein the third polishing process is stopped on the package component.

12. The method of claim 11, wherein the first polishing process is stopped on the oxide-based layer, and the second polishing process is stopped on the first nitride-based layer.

13. The method of claim 11, wherein the package component comprises a wafer.

14. The method of claim 11, wherein depositing each of the silicon base carrier, the oxide-based layer, the first nitride-based layer, and the third nitride-based layer comprises depositing a homogeneous layer.

15. The method of claim 14 further comprising forming an alignment mark in the second nitride-based layer.

16. The method of claim 15, wherein the alignment mark extends from a top surface of the second nitride-based layer to an intermediate level between the top surface and a bottom surface of the second nitride-based layer.

17. The method of claim 15, wherein the alignment mark penetrates through the second nitride-based layer.

18. A method comprising:
forming a composite carrier comprising:
a base carrier;
a silicon oxide layer over and contacting the base carrier;
a silicon nitride layer over and contacting the silicon oxide layer;
a first silicon oxynitride layer over and contacting the silicon nitride layer; and
a second silicon oxynitride layer over and contacting the first silicon oxynitride layer; and
joining a package component over and bonding to the composite carrier, wherein the package component comprises:
a second silicon oxide layer bonding to the second silicon oxynitride layer.

19. The method of claim 18, wherein after the joining, the package component further comprises a semiconductor substrate spaced apart from the silicon oxide layer.

20. The method of claim 18, wherein after the joining, the package component further comprises a semiconductor substrate in physical contact with the silicon oxide layer.

\* \* \* \* \*